(12) United States Patent
Yoon et al.

(10) Patent No.: US 12,721,034 B2
(45) Date of Patent: Aug. 25, 2026

(54) ELECTROLUMINESCENT DEVICE AND SEMICONDUCTOR NANOPARTICLE

(71) Applicant: SAMSUNG ELECTRONICS CO., LTD., Suwon-si (KR)

(72) Inventors: Won Sik Yoon, Seoul (KR); Kwanghee Kim, Seoul (KR); Tae Hyung Kim, Seoul (KR); Eun Joo Jang, Suwon-si (KR); Enjung Kim, Suwon-si (KR); Dae-Hee Lee, Hwaseong-si (KR)

(73) Assignees: SAMSUNG ELECTRONICS CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 1038 days.

(21) Appl. No.: 17/893,254

(22) Filed: Aug. 23, 2022

(65) Prior Publication Data

US 2023/0096217 A1 Mar. 30, 2023

(30) Foreign Application Priority Data

Aug. 23, 2021 (KR) ........................ 10-2021-0111252

(51) Int. Cl.
*H10K 85/60* (2023.01)
*C09K 11/06* (2006.01)
(Continued)

(52) U.S. Cl.
CPC ............ *H10K 85/615* (2023.02); *C09K 11/06* (2013.01); *C09K 11/70* (2013.01);
(Continued)

(58) Field of Classification Search
CPC ............... H10K 50/117; H10K 85/615; H10K 85/6572; H10K 50/115
See application file for complete search history.

(56) References Cited

U.S. PATENT DOCUMENTS 10,961,446 B2 3/2021 Kim et al.
11,258,025 B2 2/2022 Friend et al.
2019/0367805 A1 12/2019 Kim et al.

FOREIGN PATENT DOCUMENTS

JP 2020095936 A * 6/2020
JP 2021043445 A 3/2021
(Continued)

OTHER PUBLICATIONS

Machine-generated English-language translation of KR-20200072848-A.*
(Continued)

*Primary Examiner* — Vu A Nguyen
(74) *Attorney, Agent, or Firm* — CANTOR COLBURN LLP

(57) ABSTRACT

An electroluminescent device including a first electrode, a second electrode, and a light emitting layer disposed between the first electrode and the second electrode, the light emitting layer including semiconductor nanoparticle(s), wherein the semiconductor nanoparticle(s) does not include cadmium, wherein the semiconductor nanoparticle(s) includes a polycyclic organic ligand including functional group linked to a $C_{6-50}$ condensed aromatic group, the functional group configured to link to the semiconductor nanoparticle(s), and the $C_{6-50}$ condensed aromatic group including at least three cyclic moieties that includes a first aromatic ring and a second aromatic ring, and the first aromatic ring shares two carbon atoms with a first adjacent cyclic moiety and the second aromatic ring shares two carbon atoms with the first adjacent cyclic moiety, or the second aromatic ring shares two carbon atoms with a second adjacent cyclic moiety condensed with the first adjacent cyclic moiety.

19 Claims, 5 Drawing Sheets

(51) Int. Cl.

| | |
|---|---|
| ***C09K 11/70*** | (2006.01) |
| ***H10K 50/115*** | (2023.01) |
| ***H10K 59/35*** | (2023.01) |

(52) U.S. Cl.
CPC .. *H10K 85/6572* (2023.02); *C09K 2211/1011* (2013.01); *C09K 2211/1018* (2013.01); *H10K 50/115* (2023.02); *H10K 59/35* (2023.02)

(56) References Cited

FOREIGN PATENT DOCUMENTS

| | | | | | |
|---|---|---|---|---|---|
| JP | 2021043446 A | | 3/2021 | | |
| KR | 20160148675 A | | 12/2016 | | |
| KR | 20190136801 A | | 12/2019 | | |
| KR | 20200072848 A | * | 6/2020 | ............. | C09K 11/08 |

OTHER PUBLICATIONS

Machine-generated English-language translation of JP-2020095936-A.*

Office Action dated Jan. 7, 2026, of the corresponding Korean Patent Application No. 10-2022-0105741 with English Translation, 13 pp.

* cited by examiner

ELECTROLUMINESCENT DEVICE AND SEMICONDUCTOR NANOPARTICLE

CROSS-REFERENCE TO RELATED APPLICATION

This application claims priority to Korean Patent Application No. 10-2021-0111252 filed in the Korean Intellectual Property Office on Aug. 23, 2021, and all the benefits accruing therefrom under 35 U.S.C. § 119, the contents of which in its entirety is herein incorporated by reference.

BACKGROUND

1. Field

The present disclosure relates to semiconductor nanoparticles and a device including the same.

2. Description of the Related Art

A semiconductor nanoparticle (e.g., a semiconductor nanocrystal particle) may emit light. For example, a semiconductor nanoparticle including a semiconductor nanocrystal may exhibit a quantum confinement effect, and thereby, demonstrate luminance properties. For example, light emission from the semiconductor nanoparticle may occur when an electron in an excited state resulting from light excitation or an applied voltage transits from a conduction band to a valence band. The semiconductor particle may be configured to emit light of a desired wavelength region by adjusting a size and/or composition of the semiconductor nanoparticle.

Semiconductor nanoparticles may be used in a light emitting device (e.g., an electroluminescent light emitting device) and a display device including the same.

SUMMARY

An embodiment provides a luminescent device that emits light, for example, by applying a voltage to nanostructures (e.g., nanoparticles such as semiconductor nanoparticles).

An embodiment provides a display device (e.g., a QD-LED display) that includes a light emitting material having nanostructures (e.g., nanoparticle such as semiconductor nanoparticle) in a configuration of a blue pixel, a red pixel and/or a green pixel.

An embodiment provides a population, i.e., a plurality, of semiconductor nanoparticles.

An embodiment provides an electroluminescent device including a first electrode and a second electrode spaced apart from each other (e.g., each electrode having a surface opposite the other), and a light emitting layer disposed between the first electrode and the second electrode, wherein the light emitting layer includes semiconductor nanoparticle(s), wherein the semiconductor nanoparticle(s) does not include cadmium, and the semiconductor nanoparticle(s) includes a polycyclic organic ligand, wherein the polycyclic organic ligand includes a functional group (e.g., one functional group) linked to a $C_{6-50}$ condensed aromatic group, the functional group being configured to be linked to or be associated with (e.g., a surface of) the semiconductor nanoparticle(s), and the $C_{6-50}$ condensed aromatic group including at least three cyclic moieties, wherein the at least three cyclic moieties includes a first aromatic ring and a second aromatic ring, and the first aromatic ring shares two carbon atoms with a first adjacent cyclic moiety, and the second aromatic ring shares two carbon atoms with the first adjacent cyclic moiety, or the second aromatic ring shares two carbon atoms with a second adjacent cyclic moiety condensed with the first adjacent cyclic moiety.

The electroluminescent device may further include a charge auxiliary layer between the light emitting layer and the first electrode, and/or between the light emitting layer and the second electrode.

The charge auxiliary layer may include a hole auxiliary layer between the light emitting layer and the first electrode.

The charge auxiliary layer may include an electron auxiliary layer between the light emitting layer and the second electrode.

The charge auxiliary layer may include a hole auxiliary layer between the light emitting layer and the first electrode and an electron auxiliary layer between the light emitting layer and the second electrode.

The charge auxiliary layer may include a hole auxiliary layer including an organic compound, and/or an electron auxiliary layer including metal oxide nanoparticles. The electron auxiliary layer may include zinc magnesium metal oxide nanoparticles.

The semiconductor nanoparticle(s) may include a Group II-VI compound, a Group III-V compound, a Group IV-VI compound, a Group IV element or compound, a Group I-III-VI compound, a Group II-III-VI compound, a Group I-II-IV-VI compound, or a combination thereof.

The semiconductor nanoparticle(s) may have a size (or an average size) of greater than or equal to about 2 nanometers (nm).

The semiconductor nanoparticle(s) may include a core comprising a first semiconductor nanocrystal of InP, InZnP, ZnSe, ZnSeS, ZnSeTe, or a combination thereof, or a shell comprising a second semiconductor nanocrystal of ZnSe, ZnSeS, ZnS, ZnTeSe, or a combination thereof.

The semiconductor nanoparticle(s) may have a size (or an average size) of less than or equal to about 50 nm, e.g., less than or equal to about 40 nm.

In an embodiment, in the polycyclic organic ligand, only one functional group may be directly bound to the first aromatic ring, the second aromatic ring, first adjacent cyclic moiety, or second adjacent cyclic moiety.

In an embodiment, the functional group may include a carboxyl group, an amine group, an amide group, an imine group, a cyano group, a thiol group, an imide group, a sulfonic acid group, a phosphine group, a phosphine oxide group, a carboxylate group, a phosphonic acid group, a phosphinic acid group, or a hydroxy group (e.g., a hydroxy oxygen).

The first adjacent cyclic moiety may be different from the first aromatic ring.

The first adjacent cyclic moiety may be different from the second aromatic ring, and if present, the second adjacent cyclic moiety may be the same or different from the second aromatic ring.

The functional group may not include —SH (i.e., a thiol group).

The polycyclic organic ligand may be a monofunctional compound, i.e., have only one functional group.

The first adjacent cyclic moiety may be a $C_{3-5}$ or $C_{4-9}$ ring (for example, a $C_{3-5}$ or $C_{4-9}$ aromatic ring or a $C_{3-5}$ or $C_{4-9}$ non-aromatic ring).

The polycyclic organic ligand may include a compound including a group represented by $A_1$-Cy-$A_2$, wherein $A_1$ is a substituted or unsubstituted C6 to C30 aryl group, a substituted or unsubstituted C3 to C30 heteroaryl group, or a combination thereof, $A_2$ is a substituted or unsubstituted C3 to C30 aryl group, a substituted or unsubstituted C3 to C30 heteroaryl group, or a combination thereof, and Cy is a substituted or unsubstituted four- to nine-membered ring (e.g., a substituted or unsubstituted four membered ring, a substituted or unsubstituted five membered ring, a substituted or unsubstituted six membered ring, a substituted or unsubstituted seven membered ring, a substituted or unsubstituted eight membered ring, a substituted or unsubstituted nine membered ring, or a combination thereof), where $A_1$ and Cy share two carbon atoms, and $A_2$ and Cy share two carbon atoms, and Cy is different from $A_1$ and $A_2$.

The functional group may be linked to the Cy, e.g., when Cy is a five membered ring or a six membered ring.

The polycyclic organic ligand may be represented by Chemical Formula 1:

Chemical Formula 1

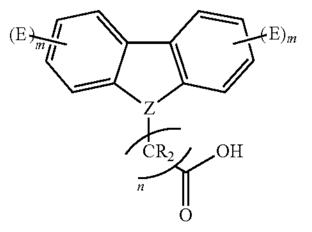

wherein, in the above formula, E is the same or different and is each independently a substituted or unsubstituted C1-10 (e.g., C1-C3) alkyl group, a substituted or unsubstituted C6-30 aryl group (e.g., a phenyl group, a naphthyl group, or the like), a substituted or unsubstituted C3-30 heteroaryl group, a halogen or halide group (e.g., a fluoro, a chloro, a bromo, or an iodo group), or any combination thereof, m is 0 to 4 (e.g., 0, 1, 2, 3, 4), Z is $-(CR')_j-$ or N (wherein, R' is hydrogen or a C1 to C3 alkyl group, and j is an integer of 1 to 5), R is the same or different, and is each independently hydrogen, a substituted or unsubstituted $C_{1-10}$ alkyl group, or any combination thereof, n is 0 or an integer of 1 to 20 (e.g., 1 to 10).

In Chemical Formula 1, in an embodiment, at least two groups E (for example, from the same or adjacent ring of the fluorenyl or carbazolyl structures) may be fused together to form a ring (e.g., an aromatic, heteroaromatic, or alicyclic ring).

The polycyclic organic ligand may include a carbazole compound, a fluorene compound, or a combination thereof, wherein the functional group (or the only one functional group) may be linked to the bridge nitrogen atom of the carbazole compound or linked to the 9-carbon position of a fluorene ring for the fluorene compound.

In a Fourier Transform Infrared (FTIR) spectrum, the light emitting layer may exhibit a first peak at a wavenumber of from about 1480 $cm^{-1}$ to about 1650 $cm^{-1}$ (or about 1500 $cm^{-1}$ to about 1570 $cm^{-1}$ or about 1545 $cm^{-1}$ to about 1560 $cm^{-1}$) and a second peak at a wavenumber of about 650 $cm^{-1}$ to about 800 $cm^{-1}$ (or about 700 $cm^{-1}$ to about 780 $cm^{-1}$ or about 735 $cm^{-1}$ to about 760 $cm^{-1}$), wherein the first peak may be assigned to an aliphatic hydrocarbon group and the second peak may be assigned to a fused aromatic ring group.

In the light emitting layer of an embodiment, an intensity ratio of the second peak to the first peak may be greater than or equal to about 0.5:1, for example, greater than or equal to about 0.8:1, and less than or equal to about 1:1, for example, less than or equal to about 0.95:1.

The semiconductor nanoparticle(s) may further include an aliphatic organic ligand that has a first functional group with a substituted or unsubstituted $C_{5-100}$ aliphatic hydrocarbon group, wherein the first functional group is configured to interact with (e.g., linked to) the semiconductor nanoparticle(s).

The first functional group may include a carboxyl group, a thiol group, an amine group, an amide group, an imine group, a cyano group, an imide group, a sulfonic acid group, a phosphine group, a phosphine oxide group, a carboxylate group, a phosphonic acid group, a phosphinic acid group, a hydroxyl group, or a combination thereof.

The first functional group may be the same as the functional group of the polycyclic organic ligand. The first functional group may be different from the functional group of the polycyclic organic ligand.

The aliphatic organic ligand may include a $C_{5-45}$ or $C_{10-50}$ alkyl group, a $C_{5-45}$ or $C_{10-50}$ alkenyl group, a $C_{5-45}$ or $C_{10-50}$ alkynyl group, or a combination thereof.

The aliphatic organic ligand may include caprylic acid, capric acid, lauric acid, myristic acid, palmitic acid, stearic acid, arachidic acid, behenic acid, lignoceric acid, cerotic acid, myristoleic acid, palmitoleic acid, sapienic acid, oleic acid, elaidic acid, vaccenic acid, linolenic acid, linoelaidic acid, α-linolenic acid, arachidonic acid, eicosapentaenoic acid, eruic acid, docosahexaenoic acid, or a combination thereof.

The electroluminescent device may be configured to emit red light, green light, or blue light.

The electroluminescent device may exhibit a maximum external quantum efficiency of greater than or equal to about 4%, or greater than or equal to about 6%, and less than or equal to about 100%.

The electroluminescent device may exhibit a T90 of greater than or equal to about 10 hours, greater than or equal to about 15 hours, greater than or equal to about 20 hours, greater than or equal to about 25 hours, greater than or equal to about 30 hours and less than or equal to about 2000 hours, or less than or equal to about 1500 hours, as measured by operating the device at a predetermined luminance (e.g., 2800 nit or 650 nit).

The electroluminescent device may exhibit a maximum luminance of greater than or equal to about 200,000 nit (candela per square meter or $cd/m^2$), greater than or equal to about 250,000 nit, greater than or equal to about 300,000 nit, greater than or equal to about 350,000 nit, greater than or equal to about 400,000 nit, or greater than or equal to about 450,000 nit.

The maximum luminance may be 10,000,000 nit ($cd/m^2$), less than or equal to about 5000,000 nit, less than or equal to about 1000,000 nit, less than or equal to about 900,000 nit, less than or equal to about 800,000 nit, less than or equal to about 700,000 nit, less than or equal to about 600,000 nit, less than or equal to about 500,000 nit, or less than or equal to about 450,000 nit.

The electroluminescent device may exhibit a current density of greater than or equal to about 1000 milliamperes per square centimeter ($mA/cm^2$), greater than or equal to about 1500 $mA/cm^2$, greater than or equal to about 2000 $mA/cm^2$, or greater than or equal to about 2500 $mA/cm^2$ at 8 volts in a J-V curve (for example, obtained by the measurement using the source meter)

The electroluminescent device may exhibit a current density of less than or equal to about 10,000 mA/$cm^2$, less than or equal to about 9,000 mA/$cm^2$, less than or equal to about 8000 mA/$cm^2$, less than or equal to about 7000 mA/$cm^2$, less than or equal to about 6000 mA/$cm^2$, less than or equal to about 5000 mA/$cm^2$, less than or equal to about 4000 mA/$cm^2$, less than or equal to about 3000 mA/$cm^2$, or less than or equal to about 2500 mA/$cm^2$ at 8 volts in a J-V curve.

In an embodiment, a display device or an electronic device may include the electroluminescent device.

The display device may include a first pixel and a second pixel, wherein the second pixel is configured to emit light different from light emitted from the first pixel, and the first pixel and/or the second pixel comprise a plurality of the semiconductor nanoparticles comprising the same or different polycyclic organic ligand.

The display device may include a polycyclic organic ligand represented by $A_1$-Cy-$A_2$, wherein $A_1$ is a substituted or unsubstituted C6 to C30 aryl group, a substituted or unsubstituted C3 to C30 heteroaryl group, or a combination thereof, $A_2$ is a substituted or unsubstituted C3 to C30 aryl group, a substituted or unsubstituted C3 to C30 heteroaryl group, or a combination thereof, and Cy is a substituted or unsubstituted five membered ring, a substituted or unsubstituted five membered ring, or a substituted or unsubstituted six membered ring, $A_1$ and the Cy share two carbon atoms, and $A_2$ and Cy share two carbon atoms, and Cy is different from $A_1$ and $A_2$.

The display device or an electronic device may include (or may be) a handheld terminal, a monitor, a notebook computer, a television, an electronic display board, a camera, a part for an automatic vehicle.

According to embodiments, the light emitting layer of the electroluminescent device may improve a hole mobility and/or a hole injection property, and thereby facilitate an improved balance between holes and electrons.

In an embodiment, the electroluminescent device may exhibit increased electroluminescent properties together with a desired or improved lifespan. In an embodiment, the electroluminescent device may exhibit improved lifespan in a display device.

DETAILED DESCRIPTION

Figure 1:
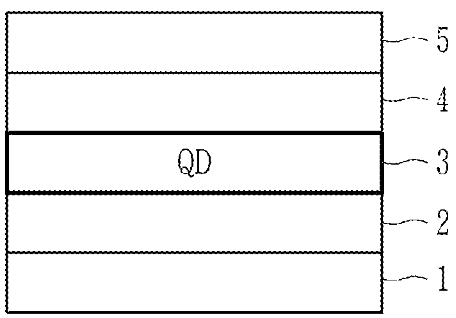
FIG. 1 is a schematic cross-sectional view of a light-emitting device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

In order to clearly explain the present disclosure, parts irrelevant to the description are omitted, and the same reference numerals are assigned to the same or similar elements throughout the specification.

The size and thickness of each constituent element as shown in the drawings are randomly indicated for better understanding and ease of description, and this disclosure is not necessarily limited to as shown. In the drawings, the thickness of layers, films, panels, regions, etc., are exaggerated for clarity. And in the drawings, for convenience of description, the thickness of some layers and regions are exaggerated. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion and does not necessarily mean "above".

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as being limited to "a" or "an." "or" means "and/or."

As used herein, the term "and/or" includes any and all combinations of one or more of the associated listed items. It will be further understood that the terms "comprises"

and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations or within ±10%, ±5%, ±3%, or ±1% of the stated value.

Hereinafter, values of a work function, a conduction band, or a lowest unoccupied molecular orbital (LUMO) (or valence band or HOMO) energy level is expressed as an absolute value from a vacuum level. In addition, when the work function or the energy level is referred to be "deep," "high" or "large," the work function or the energy level has a large absolute value based on "0 eV" of the vacuum level, while when the work function or the energy level is referred to be "shallow," "low," or "small," the work function or energy level has a small absolute value based on "0 eV" of the vacuum level.

In an embodiment, the HOMO energy level, LUMO energy level, or a work function recited herein may be a value measured by an appropriate method, which is not particularly limited. In an embodiment, the HOMO energy level, LUMO energy level, or a work function recited herein may be measured by using a Cyclic Volumetry method, a spectroscopy method such as an ultraviolet-visible (UV-Vis) spectroscopy, Ultraviolet Photoelectron Spectroscopy (UPS), a Photoelectron spectroscopy in air (e.g., AC-3), a Kelvin Probe force microscopy, or a combination thereof.

As used herein, the term "Group" may refer to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group IIIA metal may be Al, In, Ga, and TI, and examples of Group IIIB may be scandium, yttrium, or the like, but are not limited thereto.

As used herein, "Group IV" refers to Group IVA and Group IVB, and examples of a Group IVA metal may be Si, Ge, and Sn, and examples of Group IVB metal may be titanium, zirconium, hafnium, or the like, but are not limited thereto. As used herein, "metal" includes a semi-metal such as Si.

As used herein, "Group V" includes Group VA and includes nitrogen, phosphorus, arsenic, antimony, and bismuth, but is not limited thereto.

As used herein, "Group VI" includes Group VIA and includes sulfur, selenium, and tellurium, but is not limited thereto.

As used herein, the average (value) may be mean or median. In an embodiment, the average (value) may be a mean average.

In an embodiment, "linked to" may mean associated with or otherwise bound to, wherein the bond may be a Van der Waals, hydrogen, ionic, or covalent bond, but is not limited thereto. In an embodiment, an organic ligand "linked to" the semiconductor nanoparticle may not be removed by a washing process (e.g., involving a use of a non-solvent) In an embodiment, a functional group such as a thiol or hydroxy or acid (e.g., phosphinic acid) may be linked to a nanoparticle, the hydrogen atom may or may not be associated with the link, but is not limited thereto.

As used herein, when a definition is not otherwise provided, "substituted" refers to replacement of at least one hydrogen of a compound or the corresponding moiety by a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group ($—NO_2$), a cyano group (—CN), an amino group (—NRR' wherein R and R' are each independently hydrogen or a C1 to C6 alkyl group), an azido group ($—N_3$), an amidino group ($—C(=NH)NH_2$), a hydrazino group ($—NHNH_2$), a hydrazono group ($=N(NH_2)$), an aldehyde group (—C(=O)H), a carbamoyl group ($—C(O)NH_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group ($—SO_3H$) or a salt thereof ($—SO_3M$, wherein M is an organic or inorganic cation), a phosphoric acid group ($—PO_3H_2$) or a salt thereof ($—PO_3MH$ or $—PO_3M_2$, wherein M is an organic or inorganic cation), or a combination thereof.

As used herein, when a definition is not otherwise provided, "hydrocarbon" and "hydrocarbon group" refers to a compound or a group including carbon and hydrogen (e.g., alkyl, alkenyl, alkynyl, or aryl group). The hydrocarbon group may be a group having a monovalence or more formed by removal of a, e.g., one or more, hydrogen atoms from alkane, alkene, alkyne, or arene. In the hydrocarbon or hydrocarbon group, a, e.g., at least one, methylene may be replaced by an oxide moiety, a carbonyl moiety, an ester moiety, —NH—, or a combination thereof. Unless otherwise stated to the contrary, the hydrocarbon compound or hydrocarbon group (alkyl, alkenyl, alkynyl, or aryl) may have 1 to 60, 2 to 32, 3 to 24, or 4 to 12 carbon atoms.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having a carbon-carbon double bond.

As used herein, when a definition is not otherwise provided, "alkynyl" refers to a linear or branched monovalent hydrocarbon group having a carbon-carbon triple bond.

As used herein, when a definition is not otherwise provided, "aryl" refers to a group formed by removal of a, e.g., at least one, hydrogen from an arene (e.g., a phenyl or naphthyl group).

As used herein, when a definition is not otherwise provided, "hetero" refers to including 1 to 3 heteroatoms, e.g., N, O, S, Si, P, or a combination thereof.

As used herein, when a definition is not otherwise provided, "alkoxy" refers to an alkyl group linked to oxygen (e.g., alkyl-O—) for example, a methoxy group, an ethoxy group, or a sec-butyloxy group.

In an embodiment, the functional group may be "a hydroxy oxygen," that is a deprotonated hydroxyl group, and may be formed as a ligand compound including a hydroxyl group interacts (coordinates) to a quantum dot or nanoparticle with the oxygen of the deprotonated hydroxyl group.

As used herein, when a definition is not otherwise provided, "amine" group is a group represented by —NRR, (R is each independently hydrogen, a C1-C12 alkyl group, a C7-C20 alkylarylene group, a C7-C20 arylalkylene group, or a C6-C18 aryl group.

As used herein, the expression "not including cadmium (or other harmful heavy metal)" may refer to the case in which a concentration of each of cadmium (or another heavy metal deemed harmful) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

As used herein, a nanostructure or a nanoparticle is a structure having at least one region or characteristic dimension with a dimension of less than or equal to about 500 nm. In an embodiment, a dimension (or an average) of the nanostructure(s) is less than or equal to about 300 nm, less than or equal to about 250 nm, less than or equal to about 150 nm, less than or equal to about 100 nm, less than or equal to about 50 nm, or less than or equal to about 30 nm. In an embodiment, the structure may have any shape.

The nanostructure(s) may include a nanowire, a nanorod, a nanotube, a branched nanostructure, a nanotetrapod, a nanotripod, a nanobipod, a nanocrystal, a nanodot, a multi-pod type shape such as at least two pods, or the like and is not limited thereto. The nanostructure(s) or the nanoparticle(s) can be, e.g., substantially crystalline, substantially monocrystalline, polycrystalline, (for example, at least partially) amorphous, or a combination thereof.

In an embodiment, a semiconductor nanoparticle(s) or a quantum dot may exhibit quantum confinement or exciton confinement. As used herein, the term "quantum dot(s)" or "semiconductor nanoparticle(s)" is not limited in its shape unless otherwise defined. A quantum dot(s) or a semiconductor nanoparticle(s) may have a size smaller than a Bohr excitation diameter for a bulk crystal material having an identical composition and may exhibit a quantum confinement effect. The quantum dot(s) or the semiconductor nanoparticle(s) may emit light corresponding to its bandgap energy by controlling a size of a nanocrystal acting as an emission center.

As used herein, the term "T90 (h)" is a time (hr) a given device takes for the brightness (e.g., luminance) to decrease to 90% of the initial brightness (100%) is determined as the given device is driven at a predetermined brightness (e.g., 650 nit).

As used herein, the term "T50 (h)" is a time (hr) a given device takes for the brightness (e.g., luminance) to decrease to 50% of the initial brightness (100%) is determined as the given device is driven at a predetermined brightness (e.g., 650 nit).

As used herein, the wording "external quantum efficiency (EQE)" is a ratio of the number of photons emitted from a light emitting diode (LED) to the number of electrons passing through the device, and can be a measurement as to how efficiently a given device converts electrons to photons and allows them to make an escape. The EQE can be determined by the following equation:

EQE=an efficiency of injection x a (solid-state) quantum yield x an efficiency of extraction.

wherein the efficiency of injection is a proportion of electrons passing through the device that are injected into the active region, the quantum yield is a proportion of all electron-hole recombination in the active region that are radiative and produce photons, the efficiency of extraction is a proportion of photons generated in the active region that escape from the given device.

As used herein, a maximum EQE is a greatest value of the EQE.

As used herein, a maximum luminance is a greatest value of the luminance a given device can achieve.

As used herein, the wording quantum efficiency may be used interchangeably with a quantum yield. In an embodiment, the quantum efficiency may be a relative quantum yield or an absolute quantum yield, for example, which can be readily measured by any commercially available equipment. The quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any method. For example, there may be two methods for measuring the fluorescence quantum yield or efficiency: the absolute method and the relative method.

The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on their PL wavelengths, but are not limited thereto.

Unless mentioned to the contrary, a numerical range recited herein includes any real number within the endpoints of the stated range and includes the endpoints thereof.

The bandgap energy of the semiconductor nanoparticle(s) may vary with a size and a composition of the nanostructure(s). For example, as a size(s) of the semiconductor nanoparticle(s) (e.g., the quantum dot(s)) increase, it (they) may have narrow energy bandgap(s) and emit light of increased emission wavelength(s). A semiconductor nanocrystal(s) has drawn attention as light emitting materials in various fields of a display device, an energy device, or a bio light emitting device. From an environmental perspective, semiconductor nanoparticle(s) substantially free of harmful heavy metal(s) such as cadmium (Cd), lead, mercury, or a combination thereof are of interest. However, there are technological difficulties in achieving a desired level of an electroluminescent property and an improved lifespan of an electroluminescent device that includes a plurality of cadmium-free semiconductor nanoparticles.

In an embodiment, an electroluminescent device may be a luminescent type of light emitting device configured to emit a desired light by applying a voltage. The light emitting device including a plurality of the cadmium-free semiconductor nanoparticles, and the display device including the same, is advantageous from an environmental point of view.

In an embodiment, an electroluminescent device includes a first electrode 1 and a second electrode 5 spaced apart each other (e.g., each having a surface opposite the other, i.e., each with a surface facing each other); and a light emitting layer 3 disposed between the first electrode 1 and the second electrode 5. See FIG. 1. The light emitting layer may not contain cadmium. The first electrode may include an anode, and the second electrode may include a cathode. Alternatively, the first electrode may include a cathode and the second electrode may include an anode. In an embodiment, the electroluminescent device may further include a hole auxiliary layer 2 between the light emitting layer and the first electrode. In an embodiment, the electroluminescent device may further include an electron auxiliary layer 4 between the light emitting layer and the second electrode.

In the electroluminescent device of an embodiment, the first electrode 10 or the second electrode 20 may be disposed on a (transparent) substrate (not shown FIG. 1). The transparent substrate may be a light extraction surface as depicted in FIG. 2 and FIG. 3.

Figure 2:
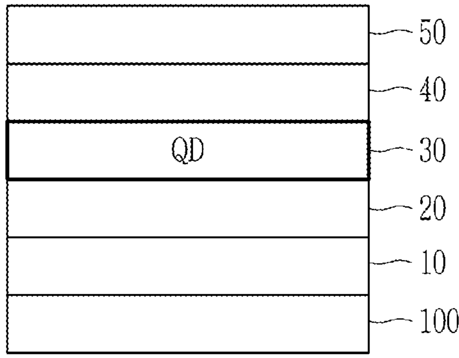
FIG. 2 is a schematic cross-sectional view of a light-emitting device according to an embodiment.
Figure 3:
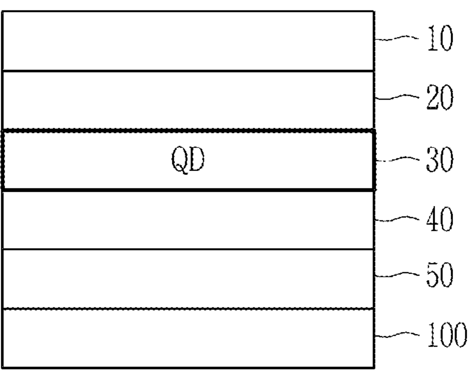
FIG. 3 is a schematic cross-sectional view of a light-emitting device according to an embodiment.

Referring to FIG. 2 and FIG. 3, in a light emitting device of an embodiment, a light emitting layer 30 may be disposed between a first electrode (e.g., anode) 10 and a second electrode (e.g., cathode) 50. The cathode 50 may include an electron injection conductor. The anode 10 may include a hole injection conductor. The work functions of the electron/hole injection conductors included in the cathode and the anode may be appropriately adjusted and are not particularly limited. For example, the cathode may have a small work function and the anode may have a relatively large work function, or vice versa.

The electron/hole injection conductors may include a metal-based material (e.g., a metal, a metal compound, an alloy, or a combination thereof) (e.g., aluminum, magnesium, tungsten, nickel, cobalt, platinum, palladium, calcium, LiF, etc.), a metal oxide such as gallium indium oxide or indium tin oxide (ITO), or a conductive polymer (e.g., having a relatively high work function) such as polyethylene dioxythiophene, but are not limited thereto.

At least one of the first electrode or the second electrode may be a light-transmitting electrode or a transparent electrode. In an embodiment, both the first electrode and the second electrode may be a light-transmitting electrode. The first electrode and/or the second electrode may be patterned electrodes. The first electrode and/or the second electrode may be disposed on a (e.g., insulating) substrate 100. The substrate 100 may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and for example, less than or equal to about 99%, or less than or equal to about 95%). The substrate 100 may include a region for a blue pixel, a region for a red pixel, a region for a green pixel, or a combination thereof. A thin film transistor may be disposed in each region of the substrate, and one of a source electrode and a drain electrode of the thin film transistor may be electrically connected to the first electrode or the second electrode.

The light-transmitting electrode may be disposed on a (e.g., insulating) transparent substrate. The substrate 100 may be a rigid or a flexible substrate. The substrate 100 may include a plastic or organic material such as a polymer, an inorganic material such as a glass, or a metal.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg:Ag, or the like, or a thin metal thin film of a single layer or a plurality of layers, but is not limited thereto. If one of the first electrode or the second electrode is an opaque electrode, it may be made of an opaque conductor such as aluminum (Al), a lithium-aluminum (Li:Al) alloy, a magnesium-silver (Mg;Ag) alloy, and lithium fluoride-aluminum (LiF:Al).

The thickness of the electrode (the first electrode and/or the second electrode) is not particularly limited and may be appropriately selected in consideration of device efficiency. For example, the thickness of the electrode may be greater than or equal to about 5 nm, for example, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers (μm), for example, less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

The light emitting layer 30 disposed between the first electrode and the second electrode (e.g., the anode 10 and the cathode 50) may include a plurality of semiconductor nanoparticles (e.g., blue light emitting nanoparticles, red light emitting nanoparticles, and/or green light emitting nanoparticles). The semiconductor nanoparticles may not comprise cadmium. The light emitting layer may include one or more (e.g., 2 or more or 3 or more and 10 or less) monolayers of a plurality of nanoparticles.

The light emitting layer may be patterned. In an embodiment, the patterned light emitting layer may include a blue light emitting layer disposed in the blue pixel. In an embodiment, the light emitting layer may further include a red light emitting layer disposed in the red pixel or a green light emitting layer disposed in the green pixel. In an embodiment, the light emitting layer may include a red light emitting layer disposed in the red pixel and a green light emitting layer disposed in the green pixel. Each of the (e.g., red, green, or blue) light emitting layers may be (e.g., optically) separated from an adjacent light emitting layer by a partition wall. In an embodiment, partition walls such as black matrices may be disposed between the red light emitting layer(s), the green light emitting layer(s), and the blue light emitting layer(s). The red light emitting layer, the green light emitting layer, and the blue light emitting layer may be optically isolated from each other.

The light emitting layer or the semiconductor nanoparticle(s) may not include cadmium. The light emitting layer or the semiconductor nanoparticle(s) may not include lead, or a combination thereof.

In an embodiment, the semiconductor nanoparticle(s) may have a core-shell structure. In an embodiment, the semiconductor nanoparticle(s) or the core-shell structure may include a core including a first semiconductor nanocrystal and a shell including a second semiconductor nanocrystal disposed on the core and having a composition different from that of the first semiconductor nanocrystal.

The semiconductor nanoparticle(s) (or the first semiconductor nanocrystal, the second semiconductor nanocrystal, or a combination thereof) may include a Group II-VI compound, a Group III-V compound, a Group IV-VI compound, a Group IV element or compound, a Group I-III-VI compound, a Group II-III-VI compound, a Group I-II-IV-VI compound, or a combination thereof.

The Group II-VI compound may be a binary element compound such as ZnS, ZnSe, ZnTe, ZnO, HgS, HgSe, HgTe, MgSe, MgS, or a combination thereof; a ternary element compound such as ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group II-VI compound may further include a Group III metal.

The Group III-V compound may be a binary element compound such as GaN, GaP, GaAs, GaSb, AlN, AlP, AlAs, AlSb, InN, InP, InAs, InSb, or a combination thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II metal (e.g., InZnP).

The Group IV-VI compound may be a binary element compound such as SnS, SnSe, SnTe, PbS, PbSe, PbTe, or a combination thereof; a ternary element compound such as SnSeS, SnSeTe, SnSTe, PbSeS, PbSeTe, PbSTe, SnPbS, SnPbSe, SnPbTe, or a combination thereof; a quaternary element compound such as SnPbSSe, SnPbSeTe, SnPbSTe, or a combination thereof; or a combination thereof.

Examples of the Group compound may be $CuInSe_2$, $CuInS_2$, CuInGaSe, and CuInGaS, but are not limited thereto.

Examples of the Group I-II-IV-VI compound may be CuZnSnSe, and CuZnSnS, but are not limited thereto.

The Group IV element or compound may include a single-element compound such as Si, Ge, or a combination thereof; a binary element compound such as SiC, SiGe, or a combination thereof; or a combination thereof.

In an embodiment, the semiconductor nanoparticle(s) or core(s) (e.g., the first semiconductor nanocrystal(s)) may include a metal including indium, zinc, or a combination thereof and a non-metal including phosphorus, selenium, tellurium, sulfur, or a combination thereof. The core may be a light emitting center. In an embodiment, the second semiconductor nanocrystal may include a metal including indium, zinc, or a combination thereof, and a non-metal including phosphorus, selenium, tellurium, sulfur, or a combination thereof.

In an embodiment, a core or a first semiconductor nanocrystal may include InP, InZnP, ZnSe, ZnSeS, ZnSeTe, or a combination thereof; the second semiconductor nanocrystal may include ZnSe, ZnSeS, ZnS, ZnTeSe, or a combination thereof. In an embodiment, the shell may include a zinc chalcogenide. The zinc chalcogenide may include zinc; and a chalcogen element (e.g., selenium, sulfur, tellurium, or a combination thereof).

In an embodiment, the semiconductor nanoparticle(s) may emit blue or green light and may include a core including ZnSeTe, ZnSe, or a combination thereof and a shell including ZnSeS.

In an embodiment, the semiconductor nanoparticle may emit green light and may include a group III-V compound including indium, phosphorus, and optionally zinc, a zinc chalcogenide (e.g., ZnSeTe), or a combination thereof. In an embodiment, the nanoparticle(s) (configured to emit green light) may include a semiconductor nanocrystal core and a semiconductor nanocrystal shell disposed on the core and including a group II-V compound. The semiconductor nanocrystal core may include an indium phosphide, an indium zinc phosphide, or a combination thereof. In an embodiment, the semiconductor nanocrystal core may include a zinc selenium telluride (ZnTeSe).

In an embodiment, the red light emitting nanoparticle(s) may include a (semiconductor nanocrystal) core including indium (In), phosphorus (P), and optionally, zinc (Zn) and a (semiconductor nanocrystal) shell disposed on the surface of the core and including zinc, sulfur, and optionally, selenium.

The semiconductor nanocrystal shell or the zinc chalcogenide may include zinc and a chalcogen element (e.g., sulfur, selenium, or a combination thereof). A content of sulfur in the shell may increase or decrease in a radial direction (from the core toward the surface), e.g., the content of sulfur may have a concentration gradient wherein the concentration of sulfur varies radially (e.g., decreases or increases toward the core).

In an embodiment, the shell may have a composition that varies in a radial direction. In an embodiment, the shell may be a multilayered shell including two or more layers. In the multilayered shell, adjacent two layers may have different compositions from each other. In the multilayered shell, a, e.g., at least one, layer may independently include a semiconductor nanocrystal having a single composition. In the multilayered shell, a, e.g., at least one, layer may independently have an alloyed semiconductor nanocrystal. In the multilayered shell, a, e.g., at least one, layer may have a concentration gradient that varies radially in terms of a composition of a semiconductor nanocrystal.

In an embodiment, the multi-layered shell may include a first shell layer disposed (directly) on the core and an outer layer (e.g., an outermost layer) disposed (directly) on the first shell layer, and the first shell layer may include ZnSe, ZnSeS, or a combination thereof. The outer shell or the outermost shell layer may include ZnS. The shell may include a gradient alloy having a concentration gradient wherein an amount of the sulfur may increase (or decrease) away from the core.

In the core-shell nanoparticle(s), a material of the shell may have a bandgap energy that is larger, e.g., greater than that of the core, but it is not limited thereto. The material of the shell may have a bandgap energy that is smaller, e.g., less than the bandgap energy that of the core. In the case of the multilayered shell, the bandgap energy of the outermost layer material of the shell may be greater than the bandgap energies of the core and the inner layer material of the shell (layers that are closer to the core). In the case of the multilayered shell, a semiconductor nanocrystal of each layer is selected to have an appropriate bandgap, thereby effectively showing, e.g., exhibiting, a quantum confinement effect.

A size (or an average size) of the core(s) may be greater than or equal to about 0.5 nm, greater than or equal to about 1 nm, greater than or equal to about 2 nm, greater than or equal to about 3 nm, greater than or equal to about 4 nm, or greater than or equal to about 5 nm. A size (or an average size) of the core(s) may be less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, or less than or equal to about 2 nm. A thickness of the semiconductor nanocrystal shell may be greater than or equal to about 0.1 nm, greater than or equal to about 0.3 nm, greater than or equal to about 0.5 nm, greater than or equal to about 1 nm, greater than or equal to about 1.5 nm, greater than or equal to about 2 nm, or greater than or equal to about 2.5 nm and less than or equal to about 5 nm, less than or equal to about 4 nm, less than or equal to about 3 nm, less than or equal to about 2 nm, or less than or equal to about 1.5 nm.

The shape of the quantum dot(s) or the semiconductor nanoparticle(s) is not particularly limited. For example, the shape of the quantum dot(s) may include, but is not limited to, a sphere, a polyhedron, a pyramid, a multi-pod shape, a hexahedron, a cube, a cuboid, a nanotube, a nanorod, a nanowire, a nanosheet, or a combination thereof.

A maximum luminescent peak wavelength of the semiconductor nanoparticle(s) may have a wavelength region of ultraviolet to infrared wavelengths or more, e.g., greater. In an embodiment, the maximum luminescent peak wavelength of the semiconductor nanoparticle(s) may be greater than or equal to about 300 nm, greater than or equal to about 440 nm, greater than or equal to about 445 nm, greater than or equal to about 450 nm, greater than or equal to about 455 nm, greater than or equal to about 460 nm, greater than or equal to about 465 nm, greater than or equal to about 470 nm, greater than or equal to about 475 nm, greater than or equal to about 480 nm, greater than or equal to about 490 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum luminescent peak wavelength of the semiconductor nanoparticle(s) may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum luminescent peak wavelength of the semiconductor nanoparticle(s) may be in the range of about 500 nm to about 650 nm.

The semiconductor nanoparticle(s) may emit green light (for example, on an application of a voltage or irradiation with light) and the maximum luminescent peak wavelength may be in the range of greater than or equal to about 500 nm (for example, greater than or equal to about 510 nm, greater than or equal to about 515 nm) and less than or equal to about 560 nm, for example, less than or equal to about 540 nm, or less than or equal to about 530 nm.

The semiconductor nanoparticle(s) may emit red light, (for example, on an application of voltage or irradiation with light), and the maximum luminescent peak wavelength may be in the range of greater than or equal to about 600 nm, for example, greater than or equal to about 610 nm and less than or equal to about 650 nm, or less than or equal to about 640 nm.

The semiconductor nanoparticle(s) may emit blue light, (for example, on an application of voltage or irradiation with light) and the maximum luminescent peak wavelength may be greater than or equal to about 430 nm (for example, greater than or equal to about 435 nm, greater than or equal to about 440 nm, greater than or equal to about 446 nm, greater than or equal to about 449 nm, greater than or equal to about 450 nm) and less than or equal to about 480 nm (for example, less than or equal to about 470 nm, less than or equal to about 465 nm, less than or equal to about 460 nm, or less than or equal to about 455 nm).

In an embodiment, the semiconductor nanoparticle(s) may exhibit a luminescent spectrum (e.g., photo- or electroluminescent spectrum) with a relatively narrow full width at half maximum. In an embodiment, in the photo- or electroluminescent spectrum, the semiconductor nanoparticle(s) may exhibit a full width at half maximum of less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm In their luminescent spectrum, the semiconductor nanoparticle(s) may exhibit less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm. The full width at half maximum may be greater than or equal to about 12 nm, greater than or equal to about 20 nm, greater than or equal to about 25 nm, or greater than or equal to about 26 nm.

The semiconductor nanoparticle(s) may exhibit (or be configured to realize) a quantum yield (or quantum efficiency) of greater than or equal to about 10%, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or greater than or equal to about 100%. In an embodiment, the nanoparticle(s) may exhibit (or be configured to realize) a quantum yield (or quantum efficiency) of greater than or equal to about 60%, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, greater than or equal to about 69%, greater than or equal to about 70%, or greater than or equal to about 71%. The semiconductor nanoparticle(s) may exhibit (or be configured to realize) a quantum yield (or quantum efficiency) of greater than or equal to about 80%, greater than or equal to about 90%, greater than or equal to about 95%, greater than or equal to about 99%, or greater than or equal to about 100%.

The semiconductor nanoparticle(s) may have a size (or an average size, hereinafter, can be simply referred to as "size") of greater than or equal to about 1 nm and less than or equal to about 100 nm. In an embodiment, the semiconductor nanoparticle(s) may have a size of from about 1 nm to about 50 nm, for example, from about 2 nm (or about 3 nm) to about 35 nm. In an embodiment, a size (or an average size) of the semiconductor nanoparticle(s) may be greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, or greater than or equal to about 12 nm. In an embodiment, a size (or an average size) of the semiconductor nanoparticle(s) may be less than or equal to about 50 nm, less than or equal to about 40 nm, less than or equal to about 35 nm, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm. As used herein, the average may be a mean average or a median average.

As used herein, the size of the semiconductor nanoparticle (s) may refer to a diameter or an equivalent diameter obtained from a two-dimensional image of an electron microscopy analysis (e.g., under an assumption of a circle). As used herein, the size of the semiconductor nanoparticle(s) may be obtained from an inductively coupled plasma atomic emission spectroscopy analysis.

The semiconductor nanoparticle(s) may be prepared for example by a chemical wet method. In an embodiment, the semiconductor nanoparticle(s) may be prepared by a reaction between precursors in a reaction system including an organic solvent and an organic ligand. In an embodiment, for example, the method of preparing the semiconductor nanoparticle(s) having a core/shell structure may include obtaining the core; reacting shell precursors (e.g., a shell metal precursor and a shell non-metal precursor) in the presence of the core in a reaction system including an organic ligand (e.g., a native organic ligand) and an organic solvent.

In an example embodiment, in order to form the shell, a solvent and optionally, a ligand compound are heated at a predetermined temperature (e.g., greater than or equal to about 100° C.) under vacuum (or vacuum-treated) and then, after introducing an inert gas into the reaction vessel, the reaction mixture is again heat-treated at a predetermined temperature (e.g., greater than or equal to 100° C.).

A reaction temperature and a reaction time may be selected appropriately. The reaction temperature may be greater than or equal to about 180° C., greater than or equal to about 200° C., greater than or equal to about 240° C., or greater than or equal to about 280° C. and less than or equal to about 360° C., less than or equal to about 340° C., or less than or equal to about 320° C. The reaction time may be greater than or equal to about 1 minute, greater than or equal to about 30 minutes and less than or equal to about 10 hours, less than or equal to about 2 hours, or less than or equal to about 1 hour.

In an embodiment, the precursor, the organic solvent, and the (native) organic ligand may be selected appropriately and not particularly limited. In an embodiment, the organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a phosphine oxide (e.g. trioctylphosphine oxide) substituted with a (e.g., 1, 2, or 3) C6 to C22 alkyl group, a C12 to C22 aromatic ether such as phenyl ether or benzyl ether, or a combination thereof.

The organic ligand may coordinate or interact with the surfaces of the prepared nanostructures and allow the nanostructures to be well dispersed in the solution. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, wherein, R and R' each independently include C1 or more, C6 or more, or C10 or more and C40 or less, C35 or less, or C25 or less substituted or unsubstituted aliphatic hydrocarbon, or C6 to C40 substituted or unsubstituted aromatic hydrocarbon, or a combination thereof), or a combination thereof. The organic ligand may be used alone or as a mixture of two or more compounds.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, benzyl thiol, and the like; an amine compound such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, trioctylamine, and the like; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, and the like; a phosphine compound such as methyl phosphine, ethyl phosphine, propyl phosphine, butyl phosphine, pentyl phosphine, octyl phosphine, dioctyl phosphine, tributyl phosphine, trioctyl phosphine, and the like; a phosphine oxide compound such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, trioctyl phosphine oxide, and the like; a diphenyl phosphine compound, a triphenyl phosphine compound, or an oxide compound thereof; a C5 to C20 alkyl phosphinic acid such as hexyl phosphinic acid, octyl phosphinic acid, dodecane phosphinic acid, tetradecane phosphinic acid, hexadecane phosphinic acid, octadecane phosphinic acid, and the like; a C5 to C20 alkyl phosphonic acid; and the like, but are not limited thereto.

In an embodiment for example adopting a wet chemical method, after completing the reaction (for the formation of the core or for the formation of the shell), a nonsolvent is added to reaction products and nanoparticle(s) coordinated with the ligand compound may be separated. The nonsolvent may be a polar solvent that is miscible with the solvent used in the core formation and/or shell formation reactions and is not capable of dispersing the prepared nanocrystals. The nonsolvent may be selected depending on the solvent used in the reaction and may include, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The semiconductor nanocrystal particles may be separated through centrifugation, sedimentation, or chromatography. The separated nanocrystals may be washed with a washing solvent, if needed. The washing solvent has no particular limit and may have a similar solubility parameter to that of the ligand and may, for example, include hexane, heptane, octane, chloroform, toluene, benzene, and the like.

In an electroluminescent device of an embodiment or a display device including the same, the semiconductor nanoparticle(s) may include an organic ligand on a surface of the semiconductor nanoparticle.

The organic ligand may interact with (e.g., be bonded to or coordinate to) the semiconductor nanoparticle(s), e.g., the surface(s) of the semiconductor nanoparticle(s). The organic ligand may be desired for imparting a necessary dispersibility to the nanoparticle(s) during the production process of the device.

Without wishing to be bound by any theory, it is believed that the organic ligand(s) may be present as being bonded with a surface atom of the nanoparticle(s), and may contribute to the suppression of non-radiative transition resulting from the surface defects of the given nanoparticle. However, the present inventors have also found that the organic ligand(s) may have a substantial effect on the electrons and holes moving toward the light emitting layer. Without wishing to be bound by any theory, the organic ligands may form a dipole on the surface of the nanoparticle, changing the energy level of the light emitting layer.

The organic ligand(s) (e.g., a native ligand) provided from the chemical wet synthesis method, however, tends to have a relatively long organic chain for the dispersibility, and according to the research of the present inventors, it is believed that such an organic ligand may cause a substantial increase in the interparticle spacing between the nanoparticle(s), and the increased interparticle spacing may in turn have an adverse effect on the charge movement in the electroluminescent device. In this regard, the present inventors have also found that the conventional (native) ligand used in the art readily increase the insulating property of the semiconductor nanoparticle(s) and the increased amount of the conventional (native) ligand may substantially interrupt the hole injection from the hole auxiliary layer (e.g., the hole transporting layer) to the light emitting layer, which may reduce the charge movement in the light emitting layer to an unwanted level.

In the light emitting device of an embodiment, the hole mobility and the hole injection performance in the light emitting layer including the semiconductor nanoparticles described herein may be improved to secure the improved balance between the electron and the hole. The electroluminescent device of an embodiment may include the light emitting layer described herein to exhibit enhanced electroluminescent properties together with the extended lifespan.

Accordingly, in the electroluminescent device of an embodiment, the semiconductor nanoparticle(s) included in the light emitting layer may have a polycyclic organic ligand, for example, on the surfaces thereof. The polycyclic organic ligand includes one functional group that is configured to be linked to or interact with the semiconductor nanoparticle(s). The polycyclic organic ligand includes a $C_{6-50}$ (for example, $C_{7-48}$, $C_{8-45}$, $C_{9-40}$, $C_{10-35}$, $C_{11-30}$, or a combination thereof) condensed aromatic group (e.g., having at least three cyclic moieties), (e.g., one of which is) linked to a functional group.

The at least three cyclic moieties includes a first $C_{3-30}$ aromatic ring (or a heteroaromatic ring, herein, the wording "aromatic ring" may include a heteroaromatic ring) and a second $C_{3-30}$ aromatic ring (or a heteroaromatic ring), and the first aromatic ring shares two carbon atoms with a first adjacent cyclic moiety and the second aromatic ring shares two carbon atoms with the first adjacent cyclic moiety, or optionally, the second aromatic ring shares two carbon atoms with a second adjacent cyclic moiety condensed with the first adjacent cyclic moiety.

In an embodiment, a portion or all of the native ligand on the semiconductor nanoparticle(s) may be exchanged for the polycyclic organic ligand, and therefore, the semiconductor nanoparticle(s) may include the presence of both the ligand and the polycyclic organic ligand, each having a functional group that interacts with the semiconductor nanoparticle(s).

Without wishing to be bound by any theory, the polycyclic organic ligand of the semiconductor nanoparticle(s) may increase an appropriate level of conjugation feature (e.g., a conjugated aromatic property) substantially without suppressing the dispersibility of the nanoparticle(s), thereby enhancing the electrical conductivity of the semiconductor nanoparticle(s).

In an embodiment, the polycyclic organic ligand may include or may not include a heteroatom (e.g., nitrogen) in the ring structure. In an embodiment, the polycyclic organic ligand may include a lone pair electron and exhibit electron donating (e.g., hole accepting) property, capable of being used as a p-type donor building block.

In the polycyclic organic ligand, the first adjacent cyclic moiety (e.g., the adjacent ring) may be different from the first aromatic ring. In the polycyclic organic ligand, the first and/or second adjacent cyclic moiety (e.g., the adjacent ring) may be different from the second aromatic ring. The first aromatic ring may include a substituted or unsubstituted C6 to C30 (hetero) aryl group (for example, a substituted or unsubstituted benzene group, a substituted or unsubstituted naphthalene group, pyridine group, thiophene group, or the like). The second aromatic ring may include a substituted or unsubstituted C6 to C30 (hetero) aryl group (for example, a substituted or unsubstituted benzene group, a substituted or unsubstituted naphthalene group, pyridine group, thiophene group, or the like). The first aromatic ring may be the same as the second aromatic ring. The first aromatic ring may be different from the second aromatic ring. The first (or second) adjacent cyclic moiety (or ring) may be a substituted or unsubstituted $C_{3-5}$ cyclic moiety (for example, a $C_{3-5}$ aromatic or non-aromatic or alicyclic cyclic moiety). The first (or second) adjacent cyclic moiety may be a substituted or unsubstituted five membered cyclic moiety.

In the polycyclic organic ligand, the functional group may include a carboxyl group, a thiol group, an amine group, an amide group, an imine group, a cyano group, an imide group, a sulfonic acid group, a phosphine group, a phosphine oxide group, a carboxylate group, a phosphonic acid group, a phosphinic acid group, or a hydroxyl group (e.g., a hydroxy oxygen). In an embodiment, the functional group may include (or may be) a carboxyl group.

The functional group may not include —SH. Without wishing to be bound by any theory, the thiol group may have an adverse effect on a luminous property (e.g., a electroluminescent property) of the device.

In an embodiment, the polycyclic organic ligand may include a single functional group bonded to the semiconductor nanocrystal. In an embodiment, the polycyclic organic ligand may be a mono functional compound (e.g., that includes only one functional group in the compound). In an embodiment, the polycyclic organic ligand may include one carboxylate group, one hydroxy oxygen, or one amide group, as the only one functional group.

The polycyclic organic ligand may include a compound represented by $A_1$-Cy-$A_2$, wherein $A_1$ is a substituted or unsubstituted C6 to C30 aryl group (for example, a substituted or unsubstituted benzene group or a substituted or unsubstituted naphthalene group), a substituted or unsubstituted C3 to C30 heteroaryl group, or a combination thereof, $A_2$ is a substituted or unsubstituted C3 to C30 aryl group (for example, a substituted or unsubstituted benzene group or a substituted or unsubstituted naphthalene group), a substituted or unsubstituted C3 to C30 heteroaryl group, or a combination thereof, Cy may include a substituted or unsubstituted four membered ring, a substituted or unsubstituted five membered ring, or a substituted or unsubstituted six membered ring. In an embodiment, $A_1$ and Cy share two carbon atoms, and $A_2$ and Cy share two carbon atoms, and Cy is different from the $A_1$ and the $A_2$.

The functional group may be linked to Cy. In an embodiment, the Cy may be a five membered ring or a six membered ring. The $A_1$ and the $A_2$ may be the same or different with each other.

The functional group may be linked to A1 or A2.

The polycyclic organic ligand may be represented by Chemical Formula 1:

Chemical Formula 1

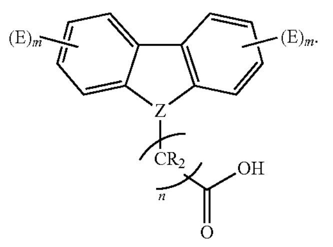

In the above formula, the E is the same or different and each independently a substituted or unsubstituted C1-10 (e.g., C1-C3) alkyl group (for example, a methyl group, a ethyl group, a propyl group, a butyl group, or a pentyl group), a substituted or unsubstituted C6-30 aryl group (e.g., a phenyl group, a benzyl group, a naphthyl group, or the like), a substituted or unsubstituted C3-30 heteroaryl group, a halogen or halide group (e.g., a fluoro, a chloro, a bromo, or an iodo group), or a combination thereof, the m is 0 to 4 (e.g., 0, 1, 2, 3, 4), Z is —$(CR')_j$— or nitrogen (N) (wherein, R' is hydrogen or a C1 to C3 alkyl group, the j is an integer of 1 to 5), R is the same or different, and each independently hydrogen, a substituted or unsubstituted $C_{1-10}$ alkyl group (for example, a methyl group, a ethyl group, a propyl group, a butyl group, or a pentyl group), or a combination thereof, the n is 0 or an integer of 1 to 20 (or 1 to 10) (for example, 0, 1, 2, 3, 4, 5, 6, 7, 8, 9, or 10).

In Chemical Formula 1, in an embodiment, E is the same or different and is each independently a substituted or unsubstituted C1-10 (e.g., C1-C3) alkyl group, a substituted or unsubstituted C6-30 aryl group (e.g., a phenyl group, a naphthyl group, or the like), a substituted or unsubstituted C3-30 heteroaryl group, a halogen or halide group (e.g., a fluoro, a chloro, a bromo, or an iodo group), or any combination thereof, wherein each substituent is independently a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a nitro group (—$NO_2$), a cyano group (—CN), an ester group (—C(═O)OR, wherein R is a C1 to C6 alkyl group or a C6 to C12 aryl group).

In an embodiment, one functional group may be present. In an embodiment, the functional group (or the one functional group) may be linked to an adjacent ring (e.g., the first adjacent cyclic moiety) bonded to the first or second aromatic ring. Without wishing to be bound by any theory, having the functional group (or the one functional group) at the non-conjugation linking part may suppress the change of the luminescent wavelength range or a luminous quenching.

In an embodiment, the polycyclic organic ligand may be linked) to (i.e., bound to or otherwise associated with) the nanoparticle(s) (e.g., a surface of the nanoparticle(s)) substantially without having any (e.g., little, or no) adverse effect on the properties (for example, the electroluminescent properties) of the nanoparticle(s). In an embodiment, the surface exchange for the polycyclic organic ligand may be conducted by dispersing the semiconductor nanoparticle(s) in a first organic solvent (for example, a C1 to C100, C5-C50, or C10 to C30 aliphatic or aromatic hydrocarbon solvent) to obtain a dispersion; dissolving the polycyclic organic ligand in a second organic solvent (e.g., a polar solvent for example, a C1 to C10 alcohol such as methanol, ethanol, or propanol, or a combination thereof) that is miscible with the first solvent to obtain a ligand solution; combining the ligand solution with the dispersion, and heating a resulting mixture at an appropriate temperature to facilitate an exchange reaction. The heating temperature may be greater than or equal to about 60° C., greater than or equal to about 70° C., or greater than or equal to about 80° C. The heating temperature may be less than or equal to about 120° C., less than or equal to about 110° C., or less than or equal to about 100° C.

In an embodiment, the polycyclic organic ligand may include a carbazole compound, a fluorene compound, or a combination thereof, wherein the functional group may be linked to the bridge nitrogen atom of the carbazole compound or be linked to the nine-carbon position of the fluorene compound.

In an embodiment, the semiconductor nanoparticle(s) may further include an aliphatic organic ligand (e.g., a native ligand) having a first functional group and a substituted or unsubstituted $C_{5-100}$ (for example, $C_{10-90}$, $C_{12-80}$, $C_{15-75}$, $C_{20-70}$, $C_{25-65}$, or the like) aliphatic hydrocarbon group, wherein the first functional group is configured to be linked (or associated with) to the semiconductor nanoparticle(s) (e.g., a surface of the nanoparticle(s)) and the aliphatic hydrocarbon group is linked (e.g., covalently bound) to the first functional group.

In an embodiment, the light emitting layer may exhibit a first peak at in a range of a wavenumber of from about 1450

$cm^{-1}$ to about 1650 $cm^{-1}$ (for example, 1560 $cm^{-1}$, 1545 $cm^{-1}$ or the like) and a second peak at a wave number of about 650 $cm^{-1}$ to 800 $cm^{-1}$ (for example, 760 $cm^{-1}$, 735 $cm^{-1}$ or the like).

In the light emitting layer, an intensity ratio of the second peak to the first peak may be greater than or equal to about 0.1:1, greater than or equal to about 0.2:1, greater than or equal to about 0.3:1, greater than or equal to about 0.4:1, greater than or equal to about 0.5:1, greater than or equal to about 0.55:1, greater than or equal to about 0.6:1, greater than or equal to about 0.65:1, greater than or equal to about 0.7:1, greater than or equal to about 0.75:1, greater than or equal to about 0.8:1, or greater than or equal to about 0.85:1. In the light emitting layer, an intensity ratio of the second peak to the first peak may be less than or equal to about 1:1, less than or equal to about 0.95:1, less than or equal to about 0.9:1, less than or equal to about 0.8:1, less than or equal to about 0.85:1, less than or equal to about 0.7:1, less than or equal to about 0.6:1, less than or equal to about 0.5:1, or less than or equal to about 0.45:1.

The first functional group may include a carboxyl group, a thiol group, an amine group, an amide group, an imine group, a cyano group, an imide group, a sulfonic acid group, a phosphine group, a phosphine oxide group, a carboxylate group, a phosphonic acid group, a phosphinic acid group, a hydroxyl group, or a combination thereof.

The first functional group may be the same as the functional group of the polycyclic organic ligand. The first functional group may be different from the at the functional group of the polycyclic organic ligand.

The aliphatic organic ligand may include a $C_{5-45}$ or $C_{10-50}$ alkyl group, a $C_{5-45}$ or $C_{10-50}$ alkenyl group, a $C_{5-45}$ or $C_{10-50}$ alkynyl group, or a combination thereof.

The aliphatic organic ligand may include caprylic acid, capric acid, lauric acid, myristic acid, palmitic acid, stearic acid, arachidic acid, behenic acid, lignoceric acid, cerotic acid, myristoleic acid, palmitoleic acid, sapienic acid, oleic acid, elaidic acid, vaccenic acid, linolenic acid, linoelaidic acid, α-linolenic acid, arachidonic acid, eicosapentaenoic acid, eruic acid, docosahexaenoic acid, or a combination thereof.

In an electroluminescent device of an embodiment, the semiconductor nanoparticle(s) included in the light emitting layer may contribute to obtaining an improved electroluminescent property and/or a prolonged lifespan of the light emitting layer. Without wishing to be bound by any theory, it is believed that the polycyclic organic ligand may facilitate the formation of the light emitting layer of the electroluminescent device from the semiconductor nanoparticle(s), and (for example, by the inclusion of the functional group at the adjacent ring, that is, not at the first or the second aromatic ring), the surface exchange reaction may be carried out with no substantial adverse effect on the luminous properties of the semiconductor nanoparticle(s) (for example, without involving a change in the luminescent wavelength of the electroluminescence, or a decrease or a suppression of the luminous properties, and thereby, the polycyclic organic ligand may impart an improved charge mobility to the semiconductor nanoparticle(s). In addition, without wishing to be bound by any theory, it is believed that in an embodiment, the semiconductor nanoparticle(s) including the polycyclic organic ligand may exhibit not only an improved hole mobility in the light emitting layer but also an improved hole injection property from the adjacent hole auxiliary layer (e.g., hole injection layer), which may contribute to the observed improvement in lifespan of the device. In addition, the electroluminescent device including the light emitting layer of the embodiment may exhibit improved current density.

In an embodiment, as measured in a hole only device having a structure of electrode (e.g. ITO)/a hole injection layer (e.g., PEDOT:PSS)/a hole transport layer (e.g., TFB)/emission layer (semiconductor nanoparticles)/an organic hole transport layer/an organic hole injection layer/an electrode (e.g. Ag), the light emitting layer may exhibit a hole transporting ability ($mA/cm^2$) at 8 volts of greater than or equal to about 0.3 $mA/cm^2$, greater than or equal to about 0.5 $mA/cm^2$, greater than or equal to about 0.6 $mA/cm^2$, greater than or equal to about 0.7 $mA/cm^2$, greater than or equal to about 0.8 $mA/cm^2$, greater than or equal to about 0.9 $mA/cm^2$, greater than or equal to about 1 $mA/cm^2$, greater than or equal to about 1.5 $mA/cm^2$, greater than or equal to about 2 $mA/cm^2$, or greater than or equal to about 2.5 $mA/cm^2$. In an embodiment, the hole transporting ability ($mA/cm^2$) at 8 volts may be less than or equal to about 10 $mA/cm^2$, less than or equal to about 9 $mA/cm^2$, less than or equal to about 8 $mA/cm^2$, less than or equal to about 7 $mA/cm^2$, less than or equal to about 6 $mA/cm^2$, less than or equal to about 5 $mA/cm^2$, less than or equal to about 4 $mA/cm^2$, less than or equal to about 3.5 $mA/cm^2$, less than or equal to about 3 $mA/cm^2$, or less than or equal to about 2 $mA/cm^2$.

In an embodiment, as measured in a hole only device having a structure of electrode (e.g. ITO)/a hole injection layer (e.g., PEDOT:PSS)/a hole transport layer (e.g., TFB)/emission layer (semiconductor nanoparticles)/an organic hole transport layer/an organic hole injection layer/an electrode (e.g. Ag), the light emitting layer may exhibit a hole transporting ability ($mA/cm^2$) at 12 volts of greater than or equal to about 2 $mA/cm^2$, greater than or equal to about 3 $mA/cm^2$, greater than or equal to about 5 $mA/cm^2$, greater than or equal to about 7 $mA/cm^2$, greater than or equal to about 9 $mA/cm^2$, greater than or equal to about 11 $mA/cm^2$, greater than or equal to about 13 $mA/cm^2$, greater than or equal to about 15 $mA/cm^2$, greater than or equal to about 17 $mA/cm^2$, greater than or equal to about 19 $mA/cm^2$, greater than or equal to about 20 $mA/cm^2$, greater than or equal to about 21 $mA/cm^2$, greater than or equal to about 23 $mA/cm^2$, greater than or equal to about 25 $mA/cm^2$, greater than or equal to about 27, greater than or equal to about 29 $mA/cm^2$, greater than or equal to about 30, greater than or equal to about 31 $mA/cm^2$, or greater than or equal to about 33 $mA/cm^2$. The hole transporting ability ($mA/cm^2$) at 12 volts may be less than or equal to about 60 $mA/cm^2$, less than or equal to about 50 $mA/cm^2$, less than or equal to about 45 $mA/cm^2$, less than or equal to about 40 $mA/cm^2$, or less than or equal to about 36 $mA/cm^2$.

In an electroluminescent device of an embodiment, a thickness of the light emitting layer may be selected appropriately. In an embodiment, the light emitting layer 3 or 30 may include a monolayer of semiconductor nanoparticles. In an embodiment, the light emitting layer 3 or 30 may include a monolayer of semiconductor nanoparticles, e.g., one or more, two or more monolayers, three or more monolayers, or four or more monolayers, and 20 monolayers or less, 10 monolayers or less, 9 monolayers or less, monolayers 8 or less, 7 monolayers or less, or 6 monolayers or less, monolayers of semiconductor nanoparticles. The light emitting layer may have a thickness of greater than or equal to about 5 nm, for example, greater than or equal to about 10 nm, greater than or equal to about 20 nm, or greater than or equal to about 30 nm, and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer may have a thickness of, for example about 10 nm to about 150 nm, for example about 20 nm to about 100 nm, or for example about 30 nm to about 50 nm.

The forming of the light emitting layer may be performed by preparing a composition including nanoparticle(s) (configured to emit desired light) and applying or depositing the composition on a substrate, for example an electrode or a charge auxiliary layer, using an appropriate method (e.g., spin coating, inkjet printing, and the like).

The electroluminescent device may further include a charge (hole or electron) auxiliary layer between the first electrode and the second electrode (e.g., an anode and a cathode). In an embodiment, the electroluminescent device may include a hole auxiliary layer 20 or an electron auxiliary layer 40 between the anode 10 and the light emitting layer 30 and/or between the cathode 50 and the light emitting layer 30. See, FIGS. 2 and 3

The light emitting device according to an embodiment may further include a hole auxiliary layer. The hole auxiliary layer 20 may be disposed between the first electrode 10 and the light emitting layer 30. The hole auxiliary layer 20 may include a hole injection layer, a hole transport layer, and/or an electron blocking layer. The hole auxiliary layer 20 may be a layer of a single component or a multilayer structure in which adjacent layers include different components.

The HOMO energy level of the hole auxiliary layer 20 may have a HOMO energy level that can be matched with the HOMO energy level of the light emitting layer 30 in order to enhance mobility of holes transferred from the hole auxiliary layer 20 to the light emitting layer 30. In an embodiment, the hole auxiliary layer 20 may include a hole injection layer close to the first electrode 10 and a hole transport layer close to the light emitting layer 30.

The material included in the hole auxiliary layer 20 (e.g., a hole transport layer, a hole injection layer, or an electron blocking layer) is not particularly limited, and may include at least one selected from, for example, poly(9,9-dioctyl-fluorene-co-N-(4)-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-Tris[phenyl(m-tolyl)amino] triphenylamine), 4,4',4"-tris(N-carbazolyl)-triphenylamine (TCTA), 1,1-bis[(di-4-toylamino)phenylcyclohexane (TAPC), a p-type metal oxide (e.g., NiO, $WO_3$, $MoO_3$, etc.), a carbon-based material such as graphene oxide, and a combinations thereof, but is not limited thereto.

In the hole auxiliary layer(s), the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, less than or equal to about for example, 40 nm, less than or equal to about 35 nm, or less than or equal to about 30 nm, but is not limited thereto.

The electron auxiliary layer 40 is disposed between the light emitting layer 30 and the second electrode 50. The electron auxiliary layer 40 may include, for example, an electron injection layer, an electron transport layer, and/or a hole blocking layer. The electron auxiliary layer may include, for example, an electron injection layer (EIL) that facilitates injection of electrons, an electron transport layer (ETL) that facilitates transport of electrons, a hole blocking layer (HBL) that blocks the movement of holes, or a combination thereof.

In an embodiment, the electron injection layer may be disposed between the electron transport layer and the cathode. For example, the hole blocking layer may be disposed between the light emitting layer and the electron transport (injection) layer but is not limited thereto. The thickness of each layer may be selected appropriately. For example, the thickness of each layer may be greater than or equal to about 1 nm and less than or equal to about 500 nm, but is not limited thereto. The electron injection layer may be an organic layer formed by vapor deposition. The electron transport layer may include inorganic oxide nanoparticles or may be an organic layer formed by vapor deposition.

The electron transport layer (ETL) and/or the electron injection layer, and/or the hole blocking layer may include at least one selected from, for example, 1,4,5,8-naphthalene-tetracarboxylic dianhydride (NTCDA), bathocuproine (BCP), tris[3-(3-pyridyl)-mesityl]borane (3TPYMB), LiF $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), an n-type metal oxide (e.g., ZnO, $HfO_2$, etc.) and a combination thereof, but is not limited thereto.

The electron auxiliary layer 40 may include an electron transport layer. The electron transport layer may include a plurality of nanoparticles. The plurality of nanoparticles may include a metal oxide containing zinc.

The metal oxide may include zinc oxide, zinc magnesium oxide, or a combination thereof. The metal oxide may include $Zn_{1-x}M_xO$, wherein M is Mg, Ca, Zr, W, Li, Ti, Y, Al, or a combination thereof and $0 \le x \le 0.5$. In an embodiment, the M in the above formula may be magnesium (Mg). In an embodiment, in the above formula, the x may be greater than or equal to about 0.01 and less than or equal to about 0.3, for example, less than or equal to about 0.25, less than or equal to about 0.2, or less than or equal to about 0.15.

The metal oxide nanoparticles may be prepared in an appropriate manner, which is not particularly limited. In an embodiment, a zinc magnesium oxide nanoparticle may be prepared by adding a zinc acetate dihydrate and a magnesium acetate tetrahydrate in a reactor at a desired mole ratio, heating a resulting mixture in an atmosphere at a temperature of about 60° C., and then adding an ethanol solution of tetramethylammonium hydroxide pentahydrate to the reaction system with stirring. The prepared $Zn_xMg_{1-x}O$ nanoparticles are separated by using centrifugation and dispersed in ethanol.

The absolute value of the LUMO of the aforementioned nanoparticle(s) included in the light emitting layer may be greater or smaller than the absolute value of the LUMO of the metal oxide. The average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

In an embodiment, each thickness of the electron auxiliary layer 40 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

A device according to an embodiment as shown in FIG. 2, the device may have a normal structure. In an embodiment, in the device, the anode 10 disposed on the transparent substrate 100 may include a metal oxide-based transparent electrode (e.g., an ITO electrode), and the cathode 50 facing the anode 10 may include a conductive metal (e.g., having a relatively low work function, Mg, Al, etc.). The hole auxiliary layer 20 (e.g., a hole injection layer such as PEDOT:PSS and/or p-type metal oxide and/or a hole transport layer such as TFB and/or PVK) may be provided between the transparent electrode 10 and the light emitting layer 30. The hole injection layer may be disposed close to the transparent electrode and the hole transport layer may be disposed close to the light emitting layer. The electron auxiliary layer 40 such as an electron injection/transport layer may be disposed between the light emitting layer 30 and the cathode 50.

A device according to another embodiment may have an inverted structure as depicted in FIG. 3. Herein, the cathode 50 disposed on the transparent substrate 100 may include a metal oxide-based transparent electrode (e.g., ITO), and the anode 10 facing the cathode may include a metal (e.g., having a relatively high work function, Au, Ag, etc.). For example, an (optionally doped) n-type metal oxide (crystalline Zn metal oxide) or the like may be disposed as an electron auxiliary layer 40 (e.g., an electron transport layer) between the transparent electrode 50 and the light emitting layer 30. $MoO_3$ or other p-type metal oxide may be disposed as a hole auxiliary layer 20 (e.g., a hole transport layer including TFB and/or PVK and/or a hole injection layer including $MoO_3$ or other p-type metal oxide) between the metal anode 10 and the light emitting layer 30.

The aforementioned device may be manufactured by an appropriate method. For example, the electroluminescent device may be manufactured by optionally forming a hole auxiliary layer (e.g., by deposition or coating) on a substrate on which an electrode is disposed, forming a light emitting layer including nanoparticle(s) (e.g., a pattern of the aforementioned nanoparticle(s)), and forming (optionally, an electron auxiliary layer and) an electrode (e.g., by vapor deposition or coating) on the light emitting layer. A method of forming the electrode/hole auxiliary layer/electron auxiliary layer may be appropriately selected and is not particularly limited.

The electroluminescent device of an embodiment may be configured to emit red light, blue light, or green light. A wavelength range of the red light, blue light, or green light may be the same as described herein.

In the electroluminescent device of an embodiment, a maximum external quantum efficiency (EQE) may be greater than or equal to about 4%, greater than or equal to about 5%, greater than or equal to about 6%, greater than or equal to about 7%, greater than or equal to about 8%, greater than or equal to about 9%, or greater than or equal to about 10%. In the electroluminescent device of an embodiment, a maximum external quantum efficiency (EQE) may be less than or equal to about 100%, less than or equal to about 90%, less than or equal to about 80%, less than or equal to about 70%, less than or equal to about 60%, less than or equal to about 50%, less than or equal to about 40%, less than or equal to about 30%, or less than or equal to about 20%.

In an embodiment, the electroluminescent device may exhibit an improved life-span. In an embodiment, as measured by driving the device at a predetermined luminance (for example, about 100 nit to about 3000 nit, about 200 nit to about 2800 nit, about 400 nit to about 2600 nit, about 600 nit to about 2500 nit, about 650 nit to about 2000 nit, or a combination thereof) the electroluminescent device may have a T90 of greater than or equal to about 10 hours, greater than or equal to about 15 hours, greater than or equal to about 20 hours, greater than or equal to about 25 hours, greater than or equal to about 30 hours, greater than or equal to about 35 hours, greater than or equal to about 40 hours, or greater than or equal to about 45 hours. The T90 may be less than or equal to about 2000 hours, less than or equal to about 1500 hours, less than or equal to about 1000 hours, less than or equal to about 500 hours, less than or equal to about 300 hours, or less than or equal to about 100 hours.

In an embodiment, the electroluminescent device may exhibit a maximum luminance of from about 200,000 nit ($cd/m^2$)-about 1000,000 nit, about 250,000 nit-about 900,000 nit, about 300,000 nit-about 800,000 nit, about 350,000 nit-about 700,000 nit, about 400,000 nit-about 600,000 nit, about 450,000 nit-about 550,000 nit, or a combination thereof.

The electroluminescent device may exhibit an improved current density. The electroluminescent device may exhibit a current density of greater than or equal to about 1000 $mA/cm^2$, greater than or equal to about 1500 $mA/cm^2$, greater than or equal to about 2000 $mA/cm^2$, or greater than or equal to about 2500 $mA/cm^2$ at 8 volts in a J-V curve (for example, obtained by the measurement using the source meter).

The electroluminescent device may exhibit a current density of less than or equal to about 10,000 $mA/cm^2$, less than or equal to about 9000 $mA/cm^2$, less than or equal to about 8000 $mA/cm^2$, less than or equal to about 7000 $mA/cm^2$, less than or equal to about 6000 $mA/cm^2$, less than or equal to about 5000 $mA/cm^2$, less than or equal to about 4000 $mA/cm^2$, less than or equal to about 3000 $mA/cm^2$, or less than or equal to about 2000 $mA/cm^2$ at 8 volts in a J-V curve.

In an embodiment, a display device including the electroluminescent device described herein.

The display device may include a first pixel and a second pixel that is configured to emit light different from the first pixel, and the first pixel and/or the second pixel comprise the semiconductor nanoparticle(s) comprising the same or different polycyclic organic ligand. The first pixel, the second pixel, or a combination thereof may include the electroluminescent device of an embodiment.

The display device may include semiconductor nanoparticles comprising the polycyclic organic ligand as represented by $A_1$-Cy-$A_2$, wherein $A_1$ is a substituted or unsubstituted C6 to C30 aryl group, a substituted or unsubstituted C3 to C30 heteroaryl group, or a combination thereof, $A_2$ is a substituted or unsubstituted C3 to C30 aryl group, a substituted or unsubstituted C3 to C30 heteroaryl group, or a combination thereof, and Cy is a substituted or unsubstituted five membered ring, a substituted or unsubstituted five membered ring, or a substituted or unsubstituted six membered ring, $A_1$ and the Cy share two carbon atoms, and $A_2$ and Cy share two carbon atoms, and Cy is different from $A_1$ and $A_2$. The display device or an electronic device may include (or may be) a handheld terminal, a monitor, a notebook computer, a television, an electronic display board, a camera, a part for an automatic vehicle.

Specific examples are described below. However, the examples described below are only for specifically illustrating or explaining the disclosure, and the scope of the disclosure is not limited thereto.

EXAMPLES

1. Electroluminescence Measurement

A current according to an applied voltage is measured with a Keithley 2635B source meter, and a CS2000 spectrometer is used to measure electroluminescent properties (e.g., luminance) of a light-emitting device.

2. Life-Span Characteristics

T90 (h): A device is driven (operated) at a predetermined brightness (e.g., 650 nit), and the time (hr) it takes for the brightness to decrease to 90% of the initial brightness (100%) is determined.

3. FT-IR Analysis

Fourier Transform Infrared Spectroscopy analysis is carried out by using Varian 670-IR with Miracle accessory.

4. Photoluminescence Analysis and Absolute Quantum Yield (QY) Measurement

Photoluminescence (PL) spectra of the nanoparticles are measured at room temperature using a Hitachi F-7000 spectrophotometer with an irradiation wavelength of 372 nanometers (nm).

The following synthesis is performed under an inert gas atmosphere (e.g., under nitrogen) unless otherwise specified. A precursor content is provided as a molar content, unless otherwise specified.

Synthesis Example 1

Indium acetate, zinc acetate, and palmitic acid are dissolved in 1-octadecene in a 200 milliliter (mL) reaction flask and heated at 120° C. under vacuum. After 1 hour, a nitrogen atmosphere is added to the reaction flask and the temperature of the reaction flask is increased to 280° C. A mixed solution of tris(trimethylsilyl)phosphine ($(TMS)_3P$) and trioctyl phosphine is rapidly injected into the reaction flask, and the reaction is allowed to continue for a predetermined time to obtain a desired first absorption wavelength in an ultraviolet-visible (UV-Vis) absorption spectrum. The reaction solution is rapidly cooled to room temperature. Acetone is added to facilitate formation of a precipitate, the precipitate is separated with a centrifuge, and the isolated precipitate is dispersed in toluene to prepare a toluene dispersion.

$(TMS)_3P$ is used in an amount of 0.75 moles per one mole of indium. The obtained InZnP semiconductor nanocrystals have an average size of about 2.5 nm.

Selenium is dispersed in trioctyl phosphine to prepare a Se/TOP stock solution, and sulfur is dispersed in trioctyl phosphine to prepare a S/TOP stock solution.

Zinc acetate and oleic acid are dissolved in trioctylamine in a 200 mL reaction flask, and the reaction mixture is vacuum-treated at 120° C. for 10 minutes. The reaction flask is filled with nitrogen ($N_2$), the solution is heated to 320° C., and the toluene dispersion of the semiconductor nanocrystal prepared above is added to the reaction flask. Thereafter, the Se/TOP stock solution, the S/TOP stock solution, and optionally zinc acetate are injected into the reaction flask and a reaction is carried out to provide a semiconductor nanocrystal including zinc, selenium, and sulfur on the InZnP semiconductor nanocrystal.

An excess amount of ethanol is added to facilitate formation of the light emitting nanostructures, which are then separated with a centrifuge. After the centrifugation, the supernatant is discarded and the precipitate is dried and then dispersed in toluene or chloroform. For the obtained semiconductor nanoparticles, a photoluminescent analysis is carried out, and the results confirms that the obtained semiconductor nanoparticles emit green light.

Synthesis Example 2

A Se/TOP stock solution, a S/TOP stock solution, and a Te/TOP stock solution are prepared by dispersing selenium (Se), sulfur(S), and tellurium (Te) in trioctylphosphine (TOP), respectively. In a reactor containing trioctylamine, 0.125 millimole (mmol) of zinc acetate is added to the reactor with oleic acid and heated at 120° C. under vacuum. After 1 hour, nitrogen is introduced into the reactor.

The reactor is heated to 300° C., and the Se/TOP stock solution and the Te/TOP stock solution in a Te:Se mole ratio of 1:20 are rapidly injected into the reactor. When the reaction is complete, the reaction solution is rapidly cooled to room temperature and acetone is added to the reactor. The resulting product mixture is centrifuged and the formed precipitate is separated and dispersed in toluene to obtain a ZnSeTe core.

1.8 mmol of zinc acetate and oleic acid are added to a flask containing trioctylamine and the obtained mixture is heated at 120° C. under vacuum for 10 minutes. Nitrogen ($N_2$) is then introduced into the reactor, to which the obtained ZnTeSe cores are added quickly followed by the addition of a Se/TOP stock solution and a S/TOP. At a reaction temperature of about 280° C., the reaction is carried out. When the reaction is complete, the reactor is cooled to room temperature and ethanol is added to facilitate precipitation of the nanoparticles, which are separated by centrifuge. The obtained nanoparticles are shown to emit blue light and are dispersed in toluene.

The PL analysis confirm that the blue light has a maximum luminescent peak wavelength of about 455 nm.

Preparation Example 1

The green light emitting semiconductor nanoparticles prepared in Synthesis Example 1 are dispersed in octane to obtain a semiconductor nanoparticle dispersion. 9-fluorene acetic acid (CAS no.: 6284-80-6) is dispersed in ethanol to provide a polycyclic organic ligand solution:

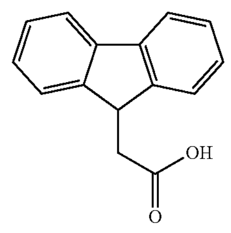 [SMILES: O=C(O)CC1c2ccccc2-c2ccccc21]

The semiconductor nanoparticle dispersion and the polycyclic organic ligand solution are mixed and a resulting mixture is stirred at 80° C. for one hour to carry out a surface exchange reaction. The reacted mixture is cooled to room temperature and ethanol is added to facilitate precipitation of the nanoparticles, which are then separated by centrifuge. The ligand treated semiconductor nanoparticles thus obtained are dispersed in octane, providing a semiconductor nanoparticle solution.

A photoluminescent spectroscopy analysis is carried out for the ligand treated semiconductor nanoparticles. A maximum luminescent peak wavelength of the ligand treated semiconductor nanoparticles is in a green light wavelength range.

Figure 4:
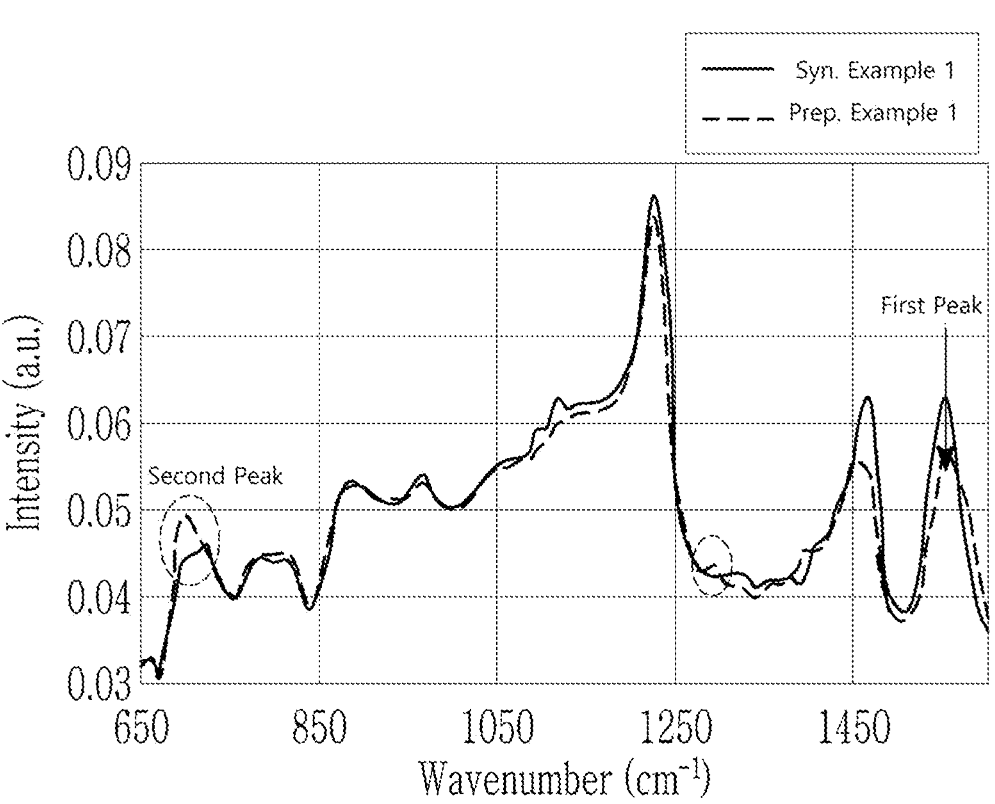
FIG. 4 shows the results of a Fourier transform infrared spectroscopy for the semiconductor nanoparticles prior to and after the ligand treatment in Preparation Example 1.

For the semiconductor nanoparticles prepared in Synthesis Example 1 and the ligand treated semiconductor nanoparticles thus prepared, a FT-IR analysis is conducted and the results are shown in FIG. 4.

FIG. 4 confirms that the ligand treated semiconductor nanoparticles show an aliphatic alkyl peak (i.e., the first peak) at a wavenumber of about 1500 $cm^{-1}$ to about 1570 $cm^{-1}$ (e.g., 1560 $cm^{-1}$ or 1545 $cm^{-1}$) and a polycyclic ring (e.g., fluorene) peak (i.e., the second peak) at a wavenumber of from about 650 $cm^{-1}$ to about 800 $cm^{-1}$ (e.g., 760 $cm^{-1}$, 735 $cm^{-1}$).

An intensity ratio of the second peak to the first peak is from about 0.8:1 to about 0.875:1.

Preparation Example 2

The ligand treated semiconductor nanoparticles are prepared in the same manner as Preparation Example 1 except for dispersing the blue light emitting semiconductor nanoparticles prepared in Synthesis Example 2 in octane instead of the green light emitting semiconductor nanoparticles. The ligand treated semiconductor nanoparticles are dispersed in octane providing a semiconductor nanoparticle solution.

A photoluminescent spectroscopy analysis is carried out for the ligand treated semiconductor nanoparticles. It is confirmed that a maximum luminescent peak wavelength of the ligand treated semiconductor nanoparticles is 454 nm.

Figure 6:
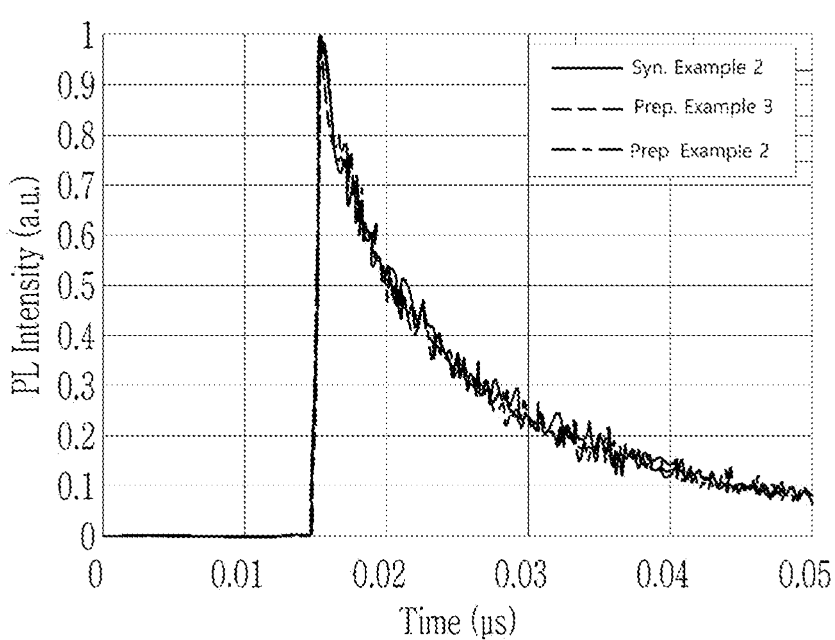
FIG. 6 shows the results of a time resolved photoluminescent spectroscopy analysis for the semiconductor nanoparticles ligand-treated in Examples 2 and 3 and the semiconductor nanoparticles prepared in Reference Example 2.

For the semiconductor nanoparticles prepared in Synthesis Example 2 and the ligand treated semiconductor nanoparticles of Preparation Example 2, a Time resolved photoluminescent spectroscopy (TRPL) analysis is conducted and the results are shown in FIG. 6. The results of FIG. 6 confirm that the TRPL curve of the ligand treated semiconductor nanoparticles is substantially the same as the TRPL curve of the semiconductor nanoparticles of Synthesis Example 2.

Preparation Example 3

The ligand treated semiconductor nanoparticles are prepared in the same manner as Preparation Example 1 except for dispersing the blue light emitting semiconductor nanoparticles prepared in Synthesis Example 2 in octane instead of the green light emitting semiconductor nanoparticles and using 9-carbazole acetic acid having the following chemical formula (CAS:131023-43-3) instead of 9-fluorene acetic acid (Cas no.: 6284-80-6):

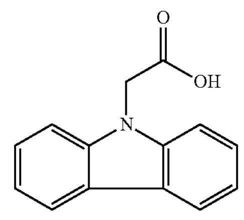 [SMILES: O=C(O)Cn1c2ccccc2c2ccccc21]

The ligand treated semiconductor nanoparticles are dispersed in octane providing a semiconductor nanoparticle solution.

A photoluminescent spectroscopy analysis is carried out for the ligand treated semiconductor nanoparticles. It is confirmed that a maximum luminescent peak wavelength of the ligand treated semiconductor nanoparticles is 455 nm.

Figure 5:
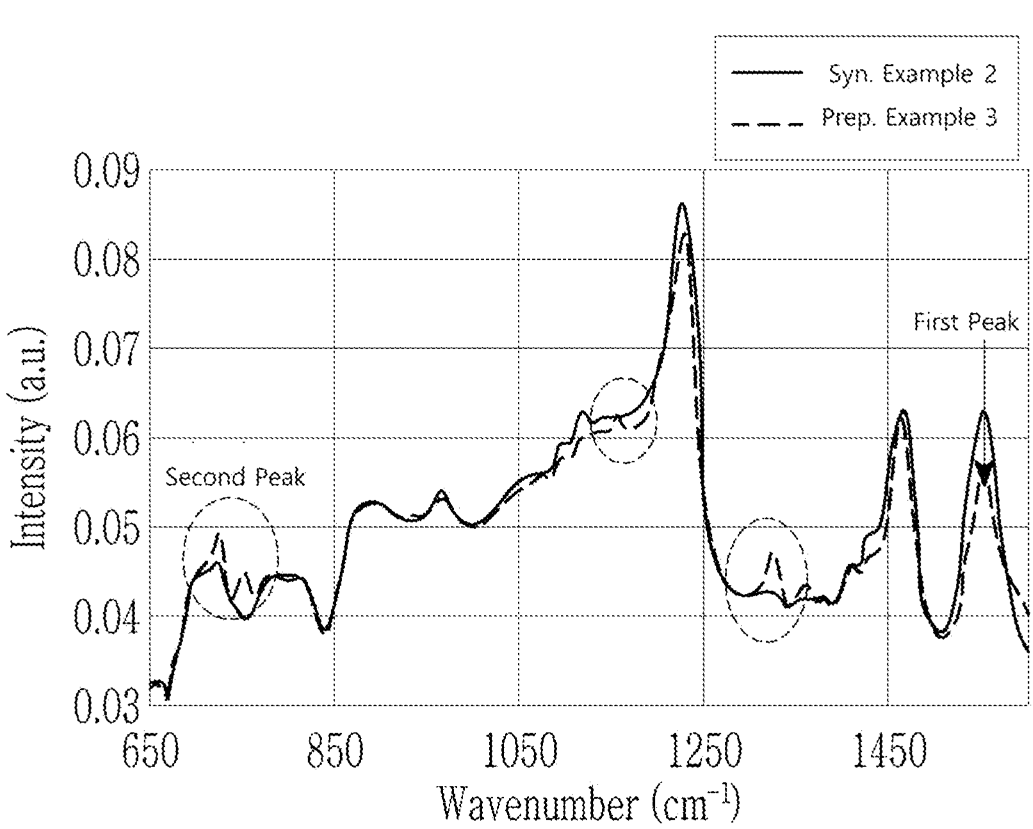
FIG. 5 shows the results of a Fourier transform infrared spectroscopy for the semiconductor nanoparticles prior to and after the ligand treatment in Preparation Example 3.

For the semiconductor nanoparticles prepared in Synthesis Example 2 and the ligand treated semiconductor nanoparticles thus prepared, a FT-IR analysis is conducted and the results are shown in FIG. 5. The FT-IR spectrum of FIG. 5 confirms that the ligand treated semiconductor nanoparticles show an aliphatic alkyl peak (i.e. the first peak) at a wavenumber of about 1500 $cm^{-1}$ to about 1570 $cm^{-1}$ (e.g., 1560 $cm^{-1}$ or 1545 $cm^{-1}$) and a polycyclic ring (e.g., carbazole) peak (i.e., the second peak) at a wavenumber of from about 650 $cm^{-1}$ to about 800 $cm^{-1}$ (e.g., 760 $cm^{-1}$, 735 $cm^{-1}$).

An intensity ratio of the second peak to the first peak is about 0.8:1.

For the ligand treated semiconductor nanoparticles of Preparation Example 3, a Time resolved photoluminescent spectroscopy (TRPL) analysis is conducted and the results are shown in FIG. 6. The results of FIG. 6 confirm that the TRPL curve of the ligand treated semiconductor nanoparticles is substantially the same as the TRPL curve of the semiconductor nanoparticles of Synthesis Example 2.

Preparation of Electroluminescent Device

Example 1

The light-emitting device having the structure ITO/PEDOT:PSS/TFB (250 angstrom)/emission layer of the semiconductor nanoparticles (250 angstrom)/ZnMgO (200 angstrom)/Al (1000 angstrom) is fabricated as below.

On an indium tin oxide (ITO) ($1^{st}$ electrode)-deposited glass substrate, a poly(3,4-ethylenedioxythiophene)polystyrene sulfonate (PEDOT:PSS) solution and poly[(9,9-dioctylfluorene-co-(4,4'-(N-4-butylphenyl)diphenylamine] solution (TFB) (Sumitomo) or PVK are spin-coated and then heat-treated to provide a hole injecting layer (HIL) and a hole transporting layer (HTL), respectively, with a thickness of 30 nm and a thickness of 25 nm, respectively. The ligand treated semiconductor nanoparticle(s) obtained from Preparation Example 1 are dispersed in octane and is spin-coated on the HTL and heat-treated to provide a light emitting layer. An electron transporting layer (ETL) including zinc magnesium oxide nanoparticles is disposed on the light emitting layer, and then an aluminum (Al) layer is vacuum-deposited on the ETL to provide a second electrically conducting layer. The electroluminescent properties of the obtained device are evaluated, and the results are shown in Table 1 and in FIG. 7 and FIG. 8.

Comparative Example 1

The green light emitting semiconductor nanoparticles prepared in Synthesis Example 1 (no ligand exchange) are used rather than the ligand treated semiconductor nanoparticles of Preparative Example 1, and an electroluminescent device is prepared in the same manner as in Example 1. The electroluminescent properties of the obtained device are evaluated, and the results are shown in Table 1.

Example 2

The ligand treated semiconductor nanoparticles prepared in Preparation Example 2 are used to prepare an electroluminescent device in the same manner as in Example 1. The electroluminescent properties of the obtained device are evaluated, and the results are shown in Table 2.

Example 3

The ligand treated semiconductor nanoparticles prepared in Preparation Example 3 are used to prepare an electroluminescent device in the same manner as in Example 1. The electroluminescent properties of the obtained device are evaluated, and the results are shown in Table 2.

Comparative Example 2

The blue light emitting semiconductor nanoparticles prepared in Synthesis Example 2 (no ligand exchange), and an electroluminescent device is prepared in the same manner as in Example 1. The electroluminescent properties of the obtained device are evaluated, and the results are shown in Table 2.

TABLE 1

| | Efficiency | | | Lifetime | |
|---|---|---|---|---|---|
| | Max. EQE | Max. Lum. | Volts @ 5 mA | T90(h) @ 2800 nit | T50(h) @ 2800 nt |
| Comp. Example 1 | 5.9% | 246,406 nits | 2.5 | 15.2 | 374.0 |
| Example 1 | 8.0% | 316,021 nits | 2.4 | 724.7 | 1806.5 |

TABLE 2

| | Max. Lum (nits) | T90(h) @650 nit (hr) |
|---|---|---|
| Comp. Example 2 | 45544 | 9.40 |
| Example 3 | 49889 | 41.11 |
| Example 2 | 49768 | 37.22 |

Figure 7:
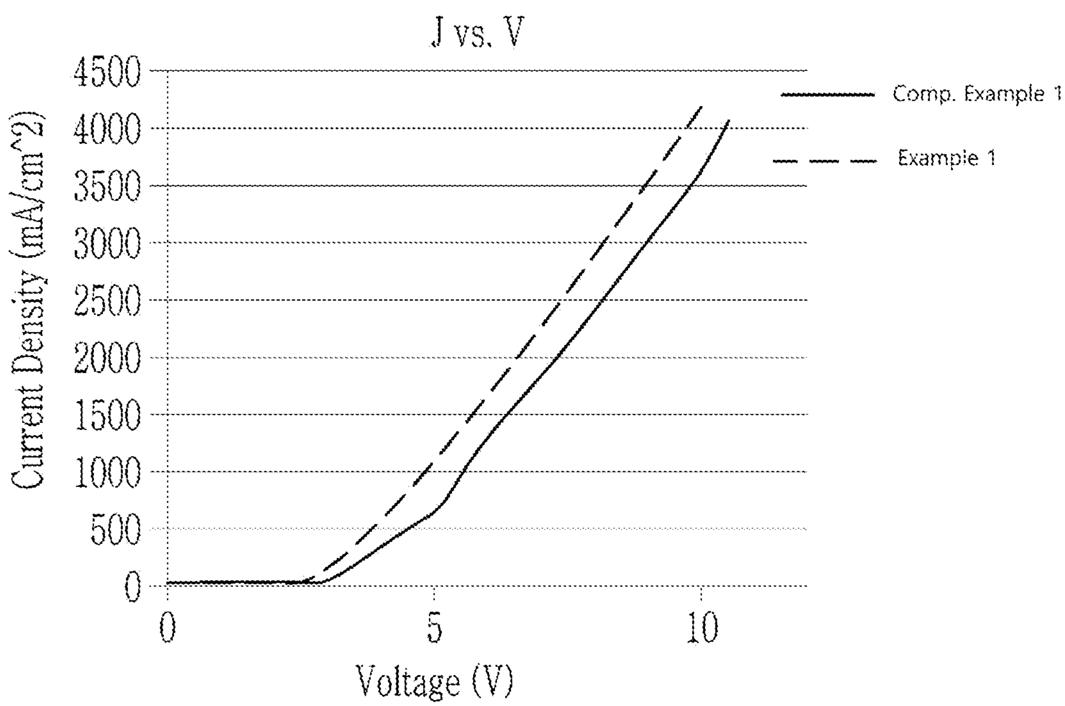
FIG. 7 shows voltage-current density curves for the devices prepared in Comparative Example 1 and Example 1, respectively.
Figure 8:
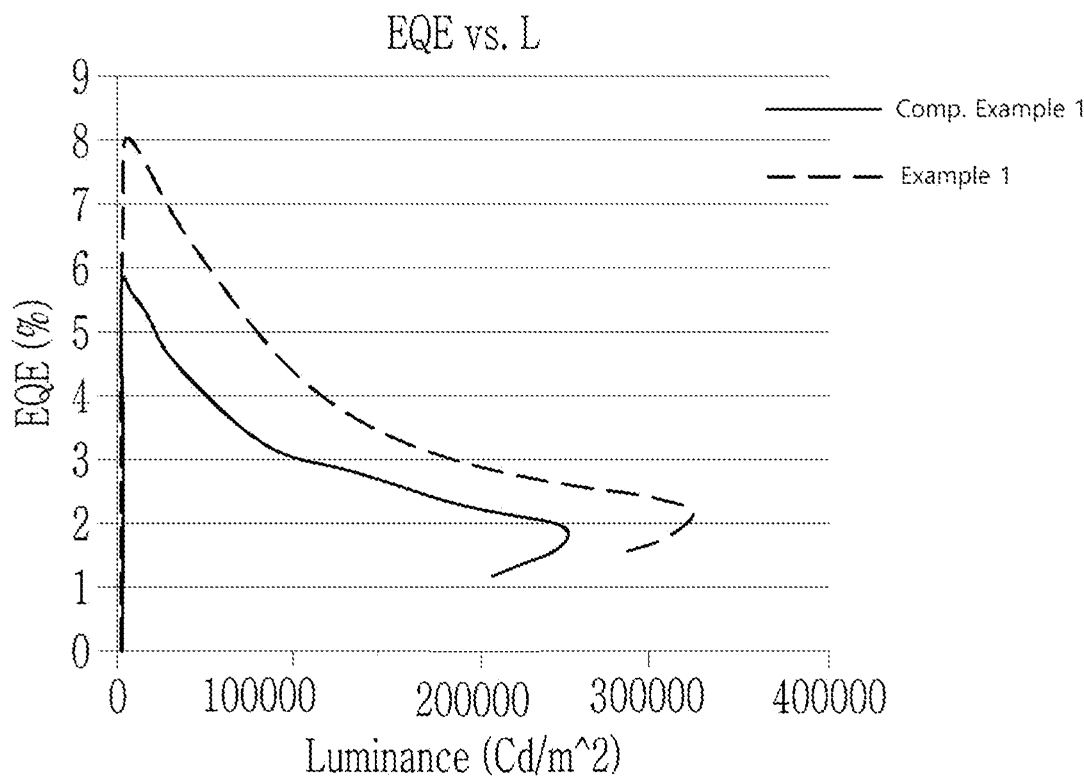
FIG. 8 shows EQE versus Luminance curves for the devices prepared in Comparative Example 1 and Example 1, respectively.

As demonstrated by the results of Table 1 and 2 as well as that of FIG. 7 and FIG. 8, the light emitting device of Examples exhibit significantly improved luminous properties as well as a significant increase in lifespan in comparison with the device of the Comparative Examples. The increase in T90 lifespan (or luminescent stability) for the device of Example 1 is nearly 50-times that of the device of Comp. Example 1, each of which is near-identical except that the Example 1 device includes the quantum dots that include the ligand exchange compound according to an embodiment.

Comparative Preparation Example 1

The ligand treated semiconductor nanoparticles are prepared in the same manner as Preparation Example 1 except for using 9-mercapto fluorene (cas no. 19552-08-0) instead of 9-fluorene acetic acid and using the blue light emitting semiconductor nanoparticles of Synthesis Example 2.

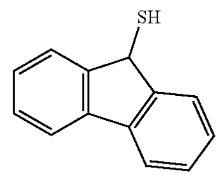 [SMILES: SC1c2ccccc2-c2ccccc21]

Comparative Example 3

The ligand treated semiconductor nanoparticles prepared in Comparative Preparation Example 1 with the ligand exchanges 9-mercapto fluorene are used to prepare an electroluminescent device in the same manner as in Example 1. The electroluminescent properties of the obtained device are evaluated, and the results demonstrate that the luminescent properties of the Comparative Example 3 device is significantly degraded and the life span is significantly lower even in comparison with the device of Comparative Example 2.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. An electroluminescent device comprising a first electrode and a second electrode spaced apart from each other; and a light emitting layer disposed between the first electrode and the second electrode, wherein the light emitting layer comprises a semiconductor nanoparticle, wherein the semiconductor nanoparticle does not comprise cadmium, wherein the semiconductor nanoparticle comprises a polycyclic organic ligand, wherein the polycyclic organic ligand is represented by Chemical Formula 1:

Chemical Formula 1

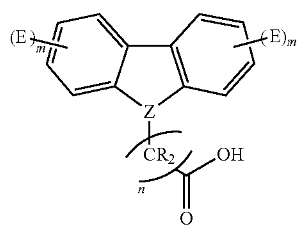

in Chemical Formula 1,

E is the same or different and is each independently a substituted or unsubstituted C1-10 alkyl group, a substituted or unsubstituted C6-30 aryl, a substituted or unsubstituted C3-30 heteroaryl group, a halogen or halide group, or any combination thereof, m is 0 or an integer of 1 to 4, Z is N, R is the same or different, and is each independently hydrogen, a substituted or unsubstituted $C_{1-10}$ alkyl group, or any combination thereof, n is 0 or an integer of 1 to 20.

2. The electroluminescent device of claim 1, wherein the electroluminescent device further comprises a hole auxiliary layer between the light emitting layer and the first electrode, or wherein the electroluminescent device further comprises an electron auxiliary layer between the light emitting layer and the second electrode, optionally wherein the hole auxiliary layer comprises an organic compound, and/or the electron auxiliary layer comprises zinc magnesium metal oxide nanoparticles.

3. The electroluminescent device of claim 1, wherein the semiconductor nanoparticle comprises a Group II-VI compound, a Group III-V compound, a Group IV-VI compound, a Group IV element or compound, a Group I-III-VI compound, a Group II-III-VI compound, a Group I-II-IV-VI compound, or a combination thereof.

4. The electroluminescent device of claim 1, wherein a size of the semiconductor nanoparticle is greater than or equal to about 2 nanometers and less than or equal to about 50 nanometers, and optionally wherein the semiconductor nanoparticle comprises a core comprising a first semiconductor nanocrystal of InP, InZnP, ZnSe, ZnSeS, ZnSeTe, or a combination thereof, and a shell comprising a second semiconductor nanocrystal of ZnSe, ZnSeS, ZnS, ZnTeSe, or a combination thereof.

5. An electroluminescent device comprising a first electrode and a second electrode spaced apart from each other; and a light emitting layer disposed between the first electrode and the second electrode, wherein the light emitting layer comprises a semiconductor nanoparticle, wherein the semiconductor nanoparticle does not comprise cadmium, wherein the semiconductor nanoparticle comprises a polycyclic organic ligand, the polycyclic organic ligand comprises a $C_{6-50}$ condensed aromatic group represented by $A_1$-Cy-$A_2$, and a functional group linked to the $C_{6-50}$ condensed aromatic group, the functional group is configured to link to the semiconductor nanoparticle, wherein first aromatic ring $A_1$ shares two carbon atoms with cyclic moiety Cy, and second aromatic ring $A_2$ shares two carbon atoms with the cyclic moiety Cy, wherein $A_1$ and $A_2$ are independently a substituted or unsubstituted C6 to C30 aryl group, a substituted or unsubstituted C3 to C30 heteroaryl group, or a combination thereof, Cy is a substituted or unsubstituted four membered ring, a substituted or unsubstituted five membered ring, or a substituted or unsubstituted six membered ring, wherein if Cy is a five membered ring then the bridge atom connecting $A_1$ with $A_2$ is nitrogen, wherein the semiconductor nanoparticle is configured to emit blue light and comprises a core comprising ZnSeTe, ZnSe, or a combination thereof, and a shell disposed on the core and comprising a zinc chalcogenide.

6. The electroluminescent device of claim 5, wherein the functional group comprises a carboxyl group, a thiol group, an amine group, an amide group, an imine group, a cyano group, an imide group, a sulfonic acid group, a phosphine group, a phosphine oxide group, a carboxylate group, a phosphonic acid group, a phosphinic acid group, or a hydroxyl group.

7. The electroluminescent device of claim 5, wherein the functional group comprises a carboxyl group and the functional group is not-SH.

8. The electroluminescent device of claim 5, wherein the polycyclic organic ligand has one functional group.

9. The electroluminescent device of claim 5, wherein the functional group is linked to Cy.

10. The electroluminescent device of claim 5, wherein the polycyclic organic ligand comprises a carbazole moiety with one functional group linked to the bridge nitrogen.

11. The electroluminescent device of claim 1, wherein in a Fourier Transform Infrared Spectrum, the light emitting layer exhibits a first peak at a wavenumber of from about 1480 $cm^{-1}$ to about 1650 $cm^{-1}$ and a second peak at a wavenumber of about 650 $cm^{-1}$ to about 800 $cm^{-1}$, wherein the first peak is assigned to an aliphatic hydrocarbon group and the second peak is assigned to a fused aromatic ring group, and wherein an intensity ratio of the second peak to the first peak is greater than or equal to about 0.5:1.

12. The electroluminescent device of claim 1, wherein the light emitting layer is configured to emit green light, and has a maximum external quantum efficiency of greater than or equal to about 6%.

13. An electroluminescent device comprising a first electrode and a second electrode spaced apart from each other; and a light emitting layer disposed between the first electrode and the second electrode, wherein the light emitting layer comprises a semiconductor nanoparticle, wherein the semiconductor nanoparticle does not comprise cadmium, wherein the semiconductor nanoparticle comprises a polycyclic organic ligand, the polycyclic organic ligand comprises a $C_{6-50}$ condensed aromatic group represented by $A_1$-Cy-$A_2$, and a functional group linked to the $C_{6-50}$ condensed aromatic group, the functional group is configured to link to the semiconductor nanoparticle, wherein first aromatic ring $A_1$ shares two carbon atoms with cyclic moiety Cy, and second aromatic ring $A_2$ shares two carbon atoms with the cyclic moiety Cy, wherein $A_1$ and $A_2$ are independently a substituted or unsubstituted C6 to C30 aryl group, a substituted or unsubstituted C3 to C30 heteroaryl group, or a combination thereof, Cy is a substituted or unsubstituted four membered ring, a substituted or unsubstituted five membered ring, or a substituted or unsubstituted six membered ring, wherein if Cy is a five membered ring then the bridge atom connecting $A_1$ with $A_2$ is nitrogen, wherein the electroluminescent device is configured to emit green light and exhibits a T90 of greater than or equal to about 20 hours, the device operating at a luminance of 2800 nit, or wherein the electroluminescent device is configured to emit blue light and exhibits a T90 of greater than or equal to about 10 hours, the device operating at a luminance of 650 nit.

14. The electroluminescent device of claim 1, wherein the electroluminescent device is configured to emit green light and exhibits a J-V curve with a current density of greater than or equal to about 2500 milliamperes per square centimeter at 8 volts, or wherein the electroluminescent device is configured to emit blue light and exhibits a J-V curve with a current density of greater than or equal to about 1500 milliamperes per square centimeter at 8 volts in a J-V curve.

15. A display device comprising the electroluminescent device of claim 1.

16. The display device of claim 15, wherein the display device comprises a first pixel and a second pixel, wherein the second pixel is configured to emit light different from light emitted from the first pixel, and wherein the first pixel and/or the second pixel comprise the plurality of semiconductor nanoparticles.

17. The display device of claim 15, wherein the display device comprises a handheld terminal, a monitor, a notebook computer, a television, an electronic display board, a camera, a part for an automatic vehicle.

18. The electroluminescent device of claim 5, wherein $A_1$ and $A_2$ are different, and $A_1$ and $A_2$ is benzene, naphthalene, pyridine, pyrimidine, or a combination thereof.

19. The electroluminescent device of claim 1, wherein the light emitting layer is configured to emit blue light, and has a maximum external quantum efficiency of greater than or equal to about 4%.

* * * * *